United States Patent
Fröhlich et al.

(10) Patent No.: US 7,018,781 B2
(45) Date of Patent: Mar. 28, 2006

(54) METHOD FOR FABRICATING A CONTACT HOLE PLANE IN A MEMORY MODULE

(75) Inventors: Hans-Georg Fröhlich, Dresden (DE); Oliver Genz, Dresden (DE); Werner Graf, Dresden (DE); Stefan Gruss, Dresden (DE); Matthias Handke, Dresden (DE); Percy Heger, Dresden (DE); Lars Heineck, Dresden (DE); Antje Laessig, Dresden (DE); Alexander Reb, Dresden (DE); Kristin Schupke, Welxdorf (DE); Momtchil Stavrev, Dresden (DE); Mirko Vogt, Dresden (DE)

(73) Assignee: Infineon Technologies, AG, Munich (DE)

( * ) Notice: Subject to any disclaimer, the term of this patent is extended or adjusted under 35 U.S.C. 154(b) by 0 days.

(21) Appl. No.: 10/811,509

(22) Filed: Mar. 29, 2004

(65) Prior Publication Data

US 2005/0003308 A1     Jan. 6, 2005

(30) Foreign Application Priority Data

Mar. 29, 2003   (DE) ................................ 103 14 274

(51) Int. Cl.
   *G03F 7/00*     (2006.01)

(52) U.S. Cl. ..................... 430/314; 430/311; 430/313; 430/316; 430/317

(58) Field of Classification Search ............... 430/311, 430/313, 314, 316, 317
See application file for complete search history.

(56) References Cited

U.S. PATENT DOCUMENTS

| | | | |
|---|---|---|---|
| 6,057,581 A * | 5/2000 | Doan | 257/401 |
| 6,096,633 A | 8/2000 | Hsu | 438/622 |
| 6,171,954 B1 | 1/2001 | Hsu | 438/656 |
| 6,287,905 B1 | 9/2001 | Kim et al. | 438/197 |
| 6,624,068 B1 * | 9/2003 | Thakar et al. | 438/654 |
| 2003/0008453 A1 | 1/2003 | Kang et al. | 438/239 |

FOREIGN PATENT DOCUMENTS

| | | |
|---|---|---|
| DE | 199 35 852 A1 | 2/2001 |
| DE | 102 23 748 A1 | 12/2002 |
| WO | 01-09948 A1 | 2/2001 |

* cited by examiner

Primary Examiner—Nicole Barreca
(74) Attorney, Agent, or Firm—Morrison & Foerster LLP

(57) ABSTRACT

Disclosed is a method for fabricating a contract hole plane in a memory module with an arrangement of memory cells each having a selection transistor. The methods can be utilized during the production of dynamic random access memory (DRAM) modules.

29 Claims, 17 Drawing Sheets

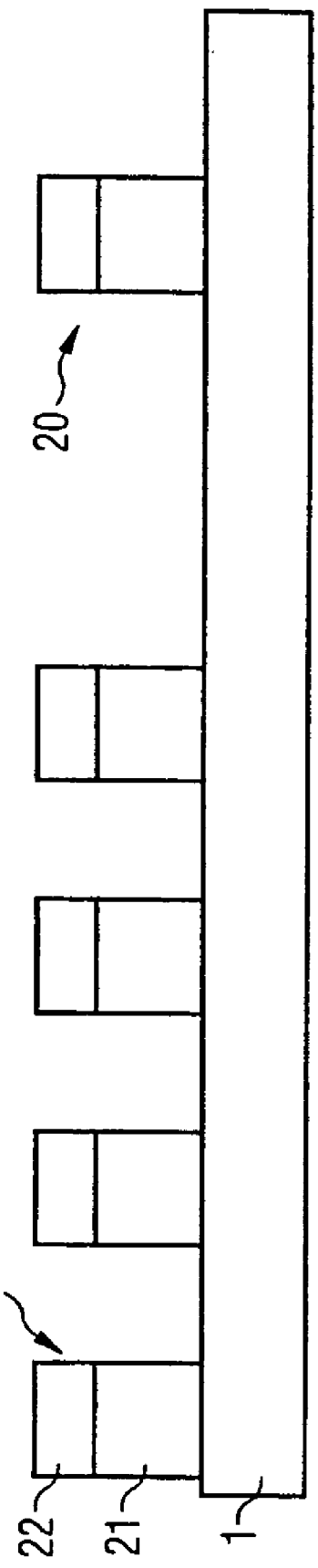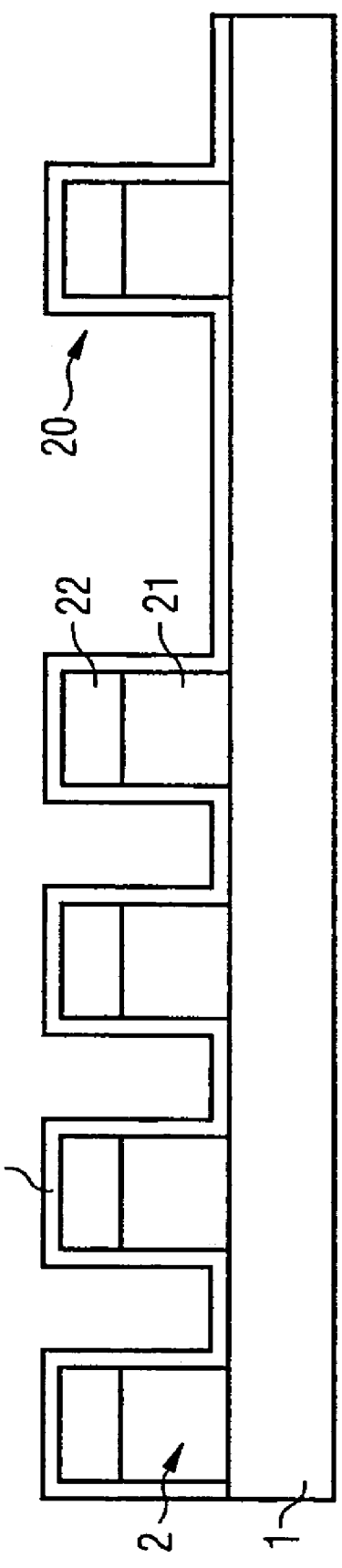

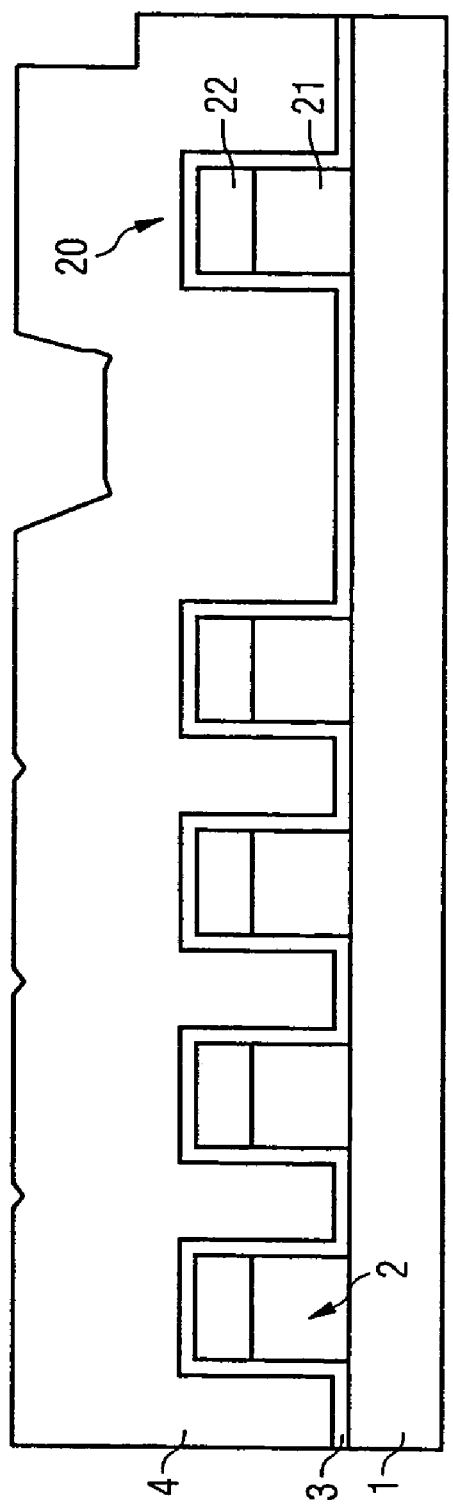
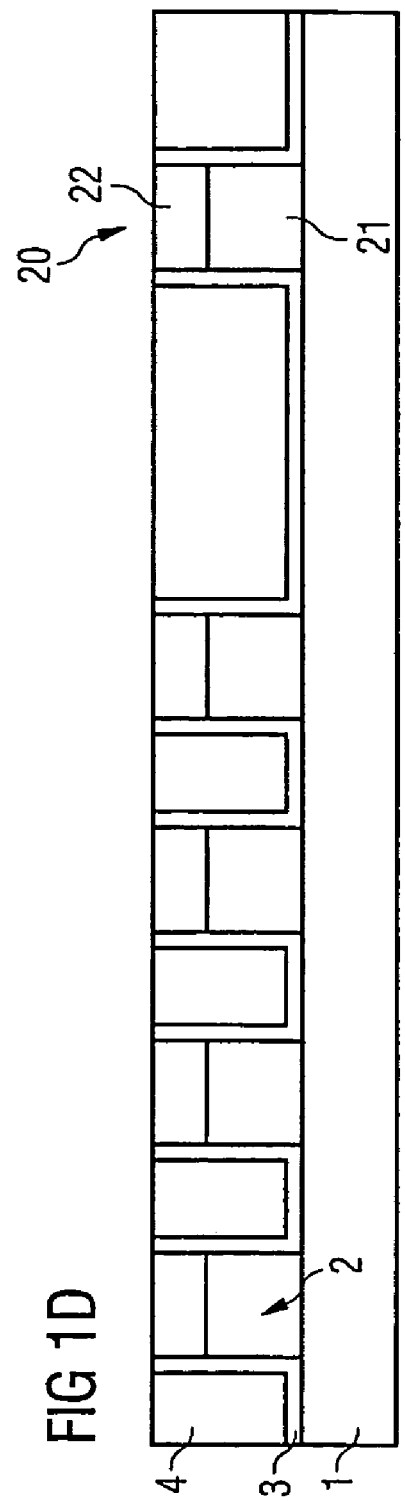

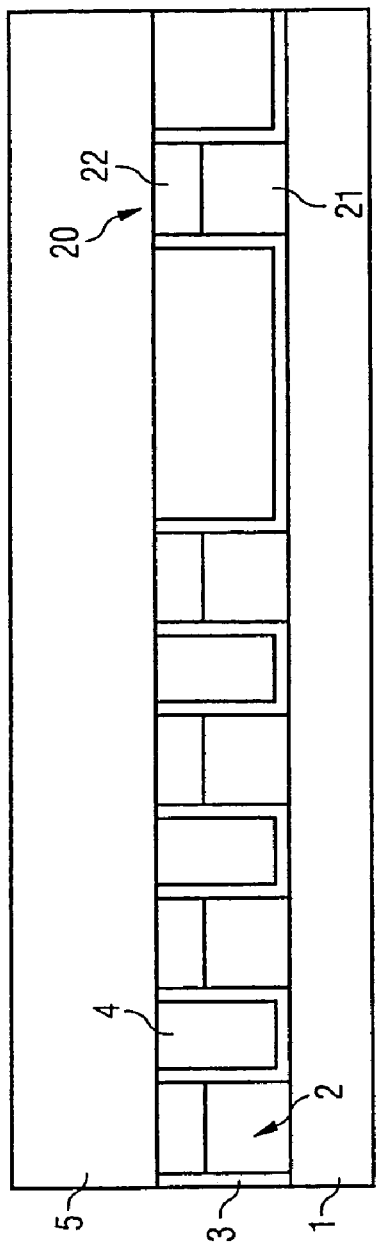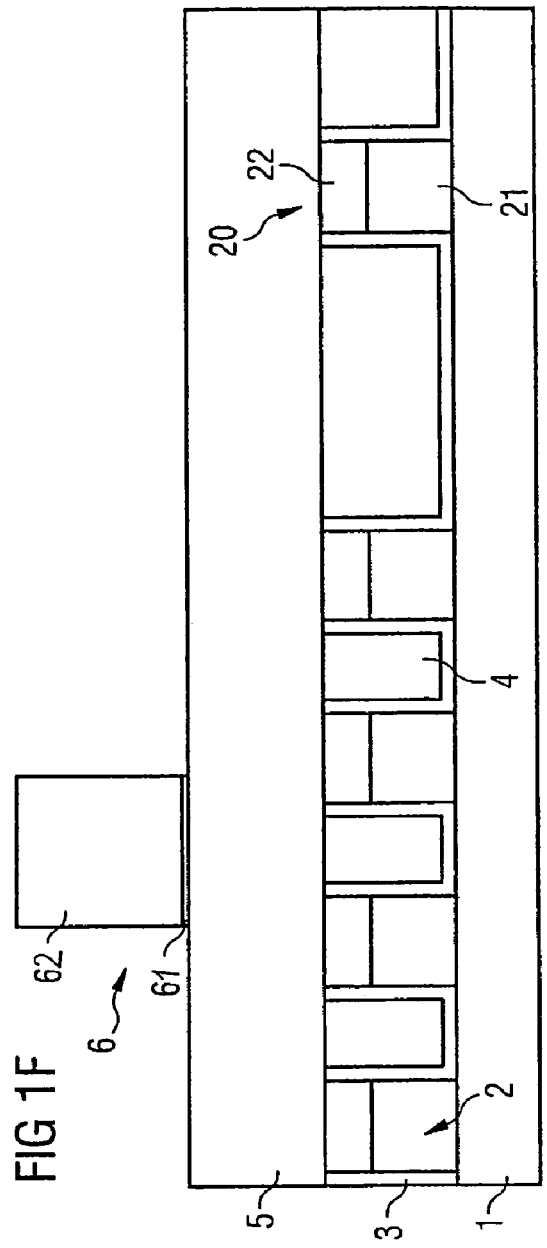

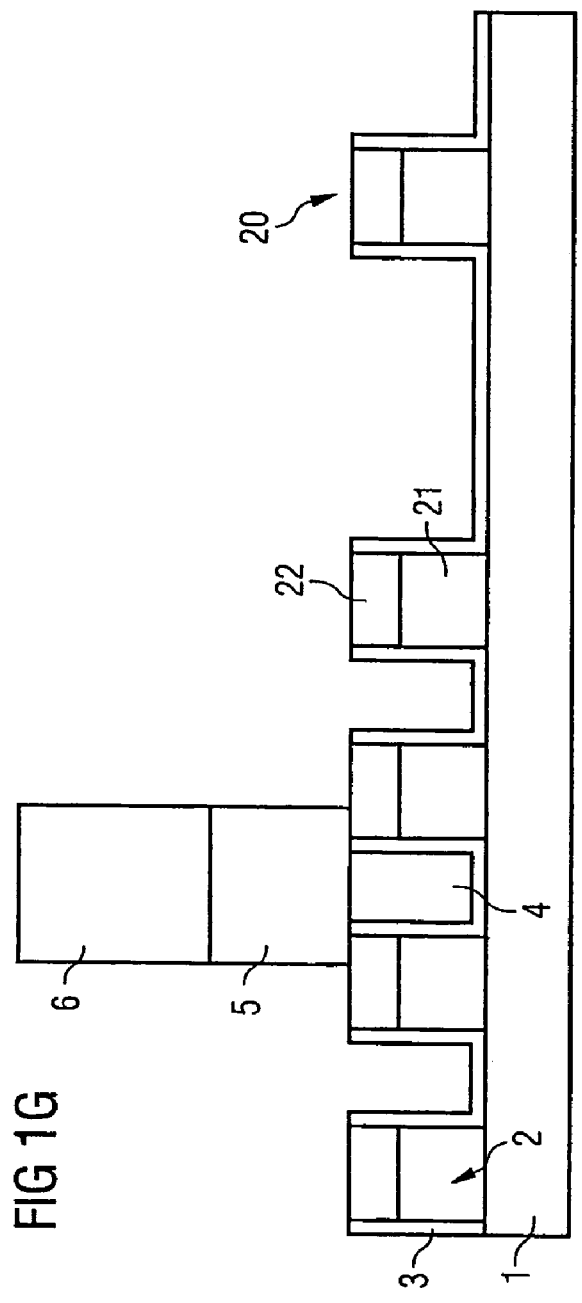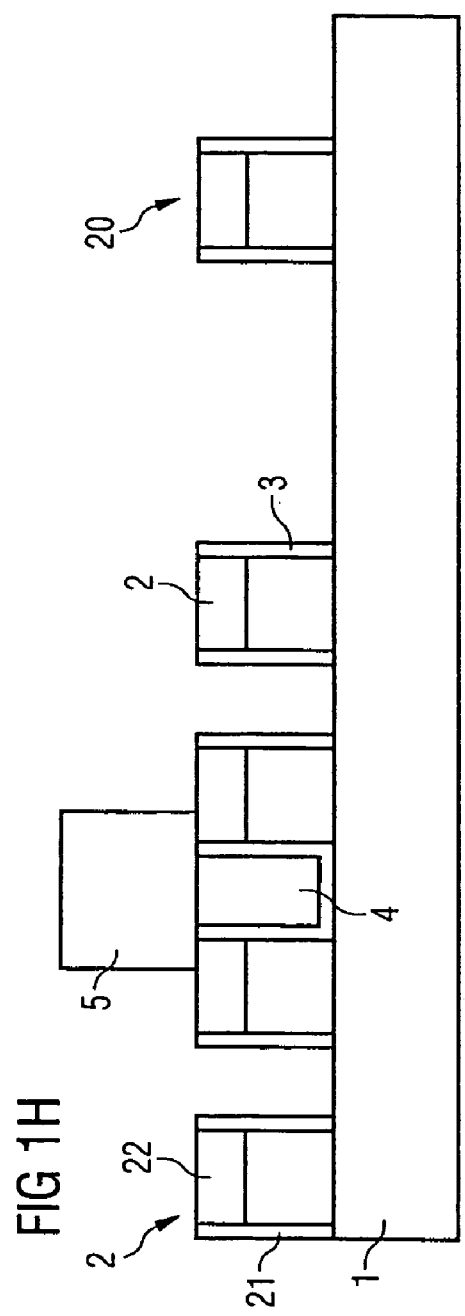

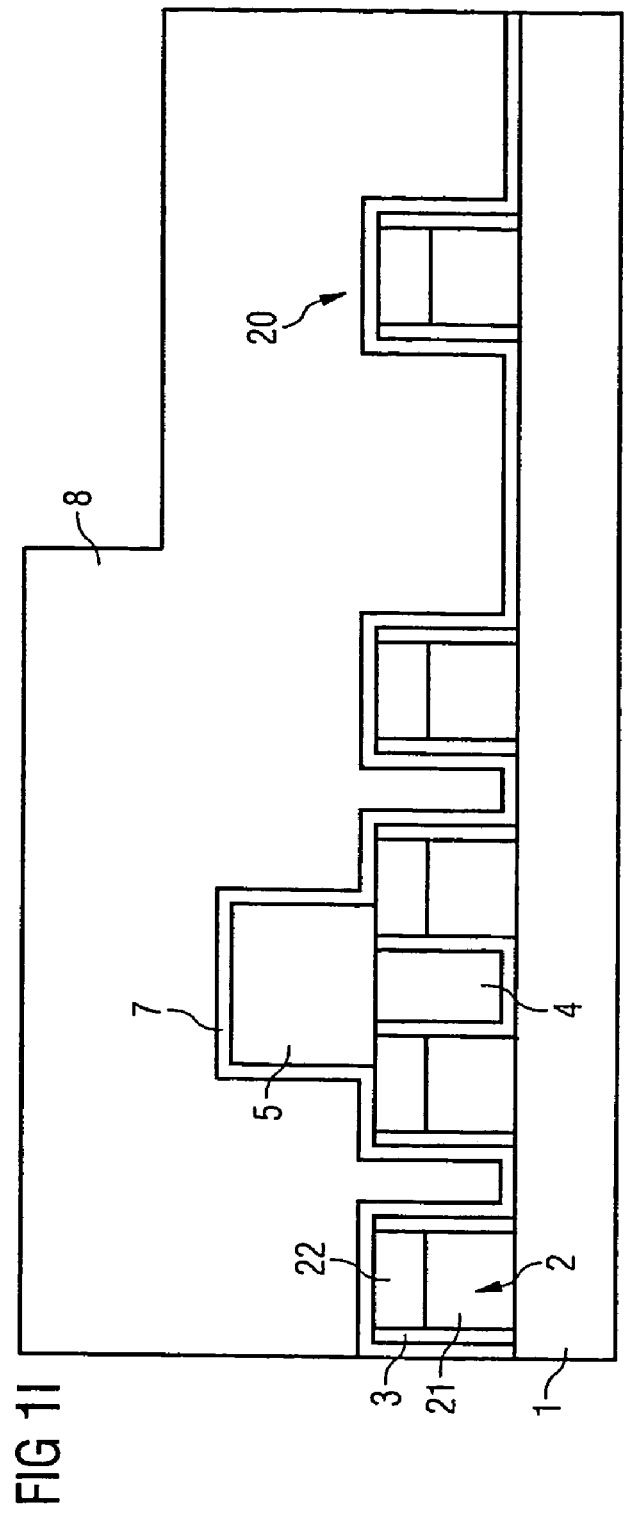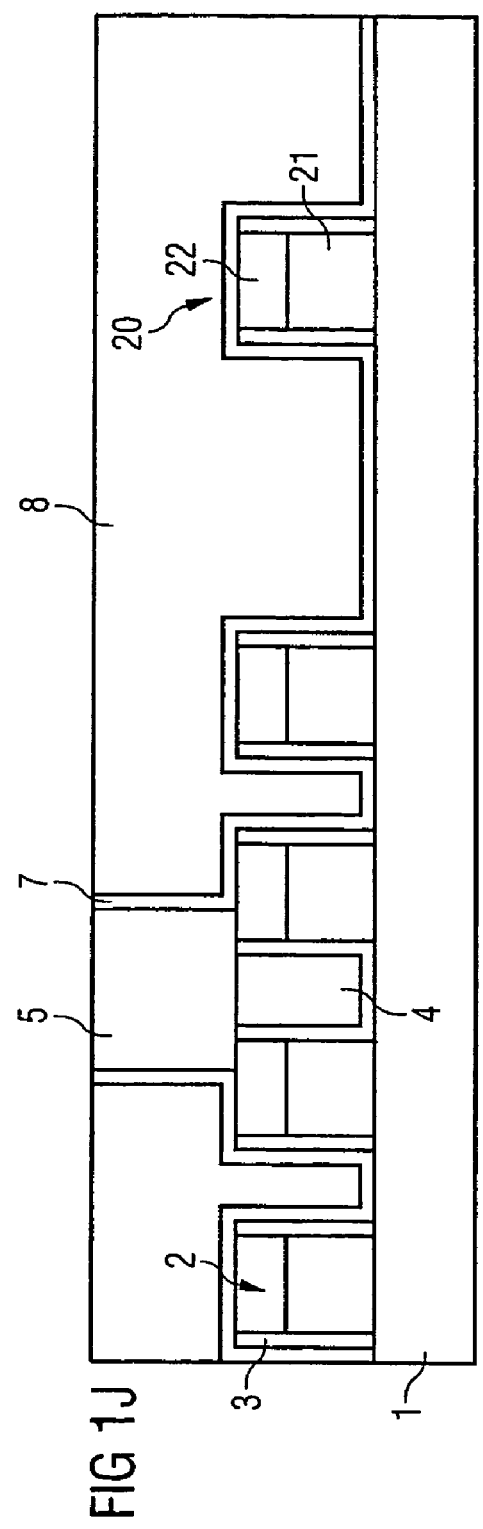

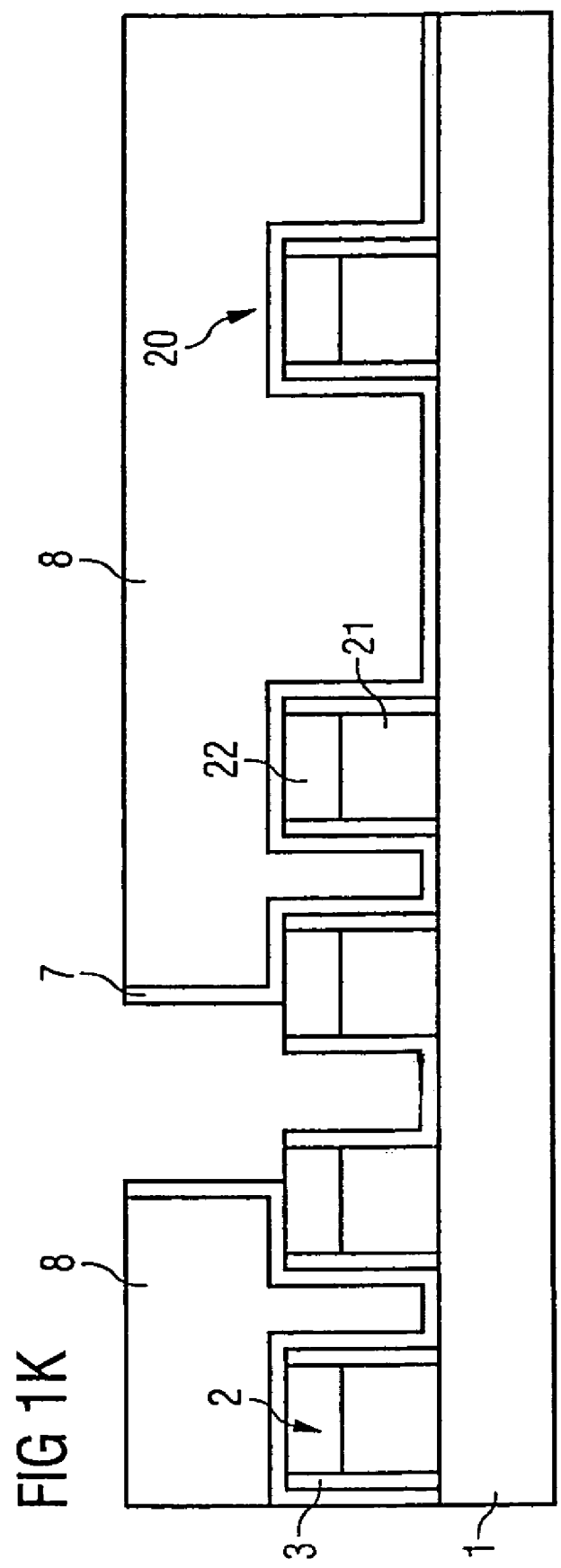

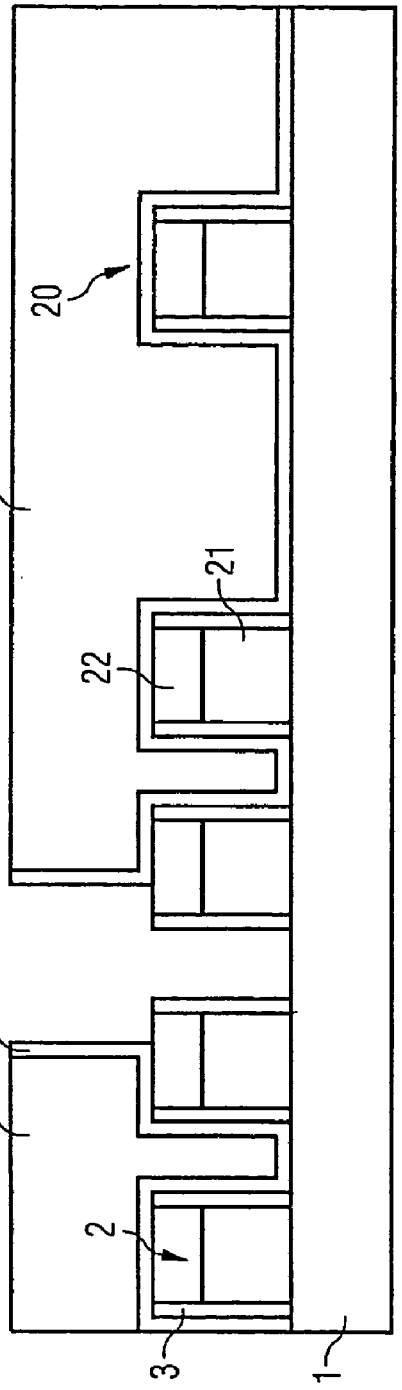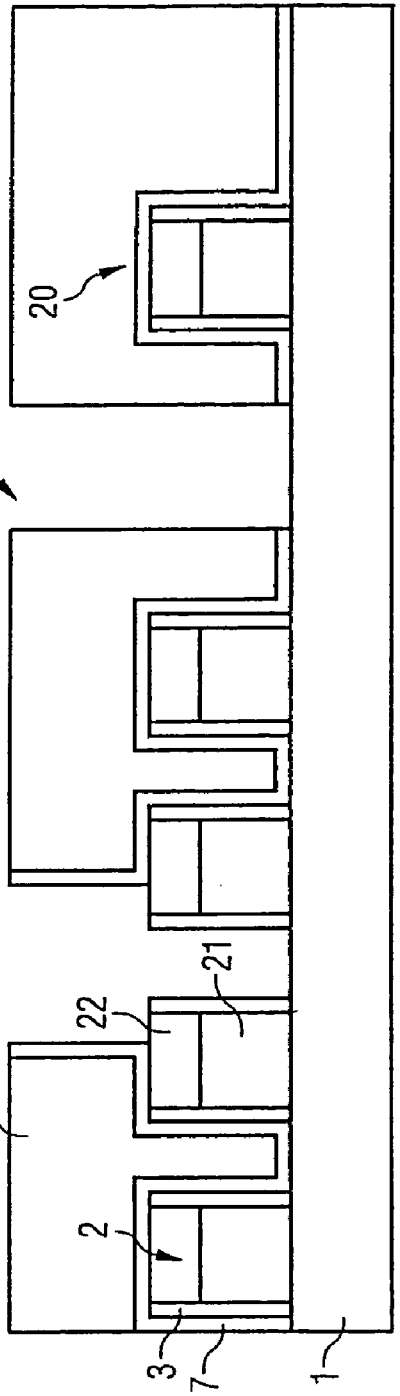

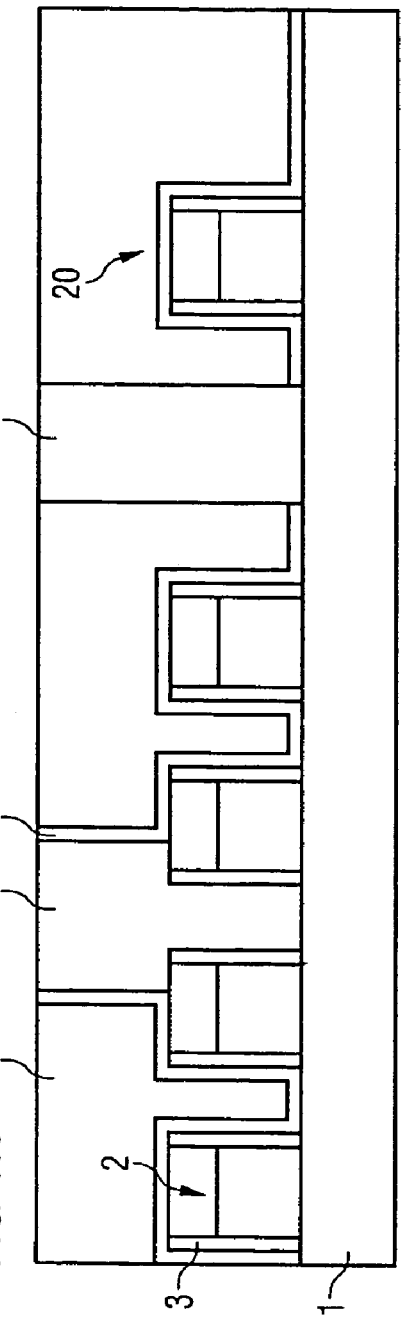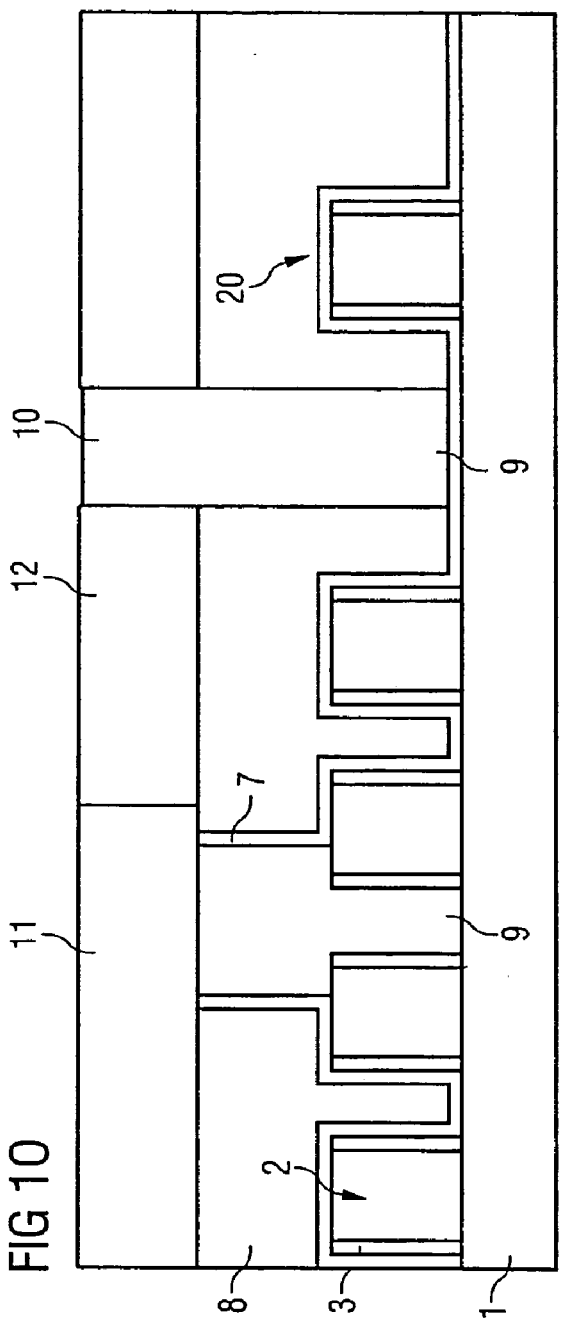

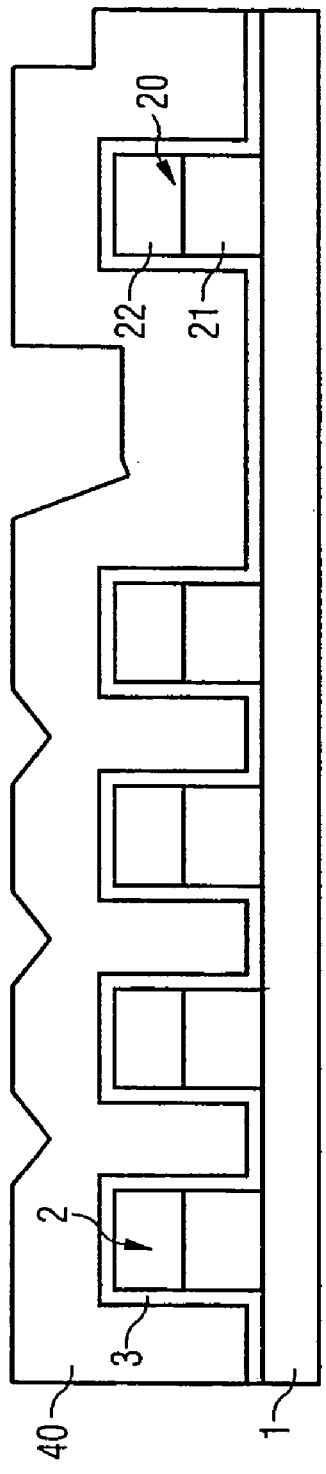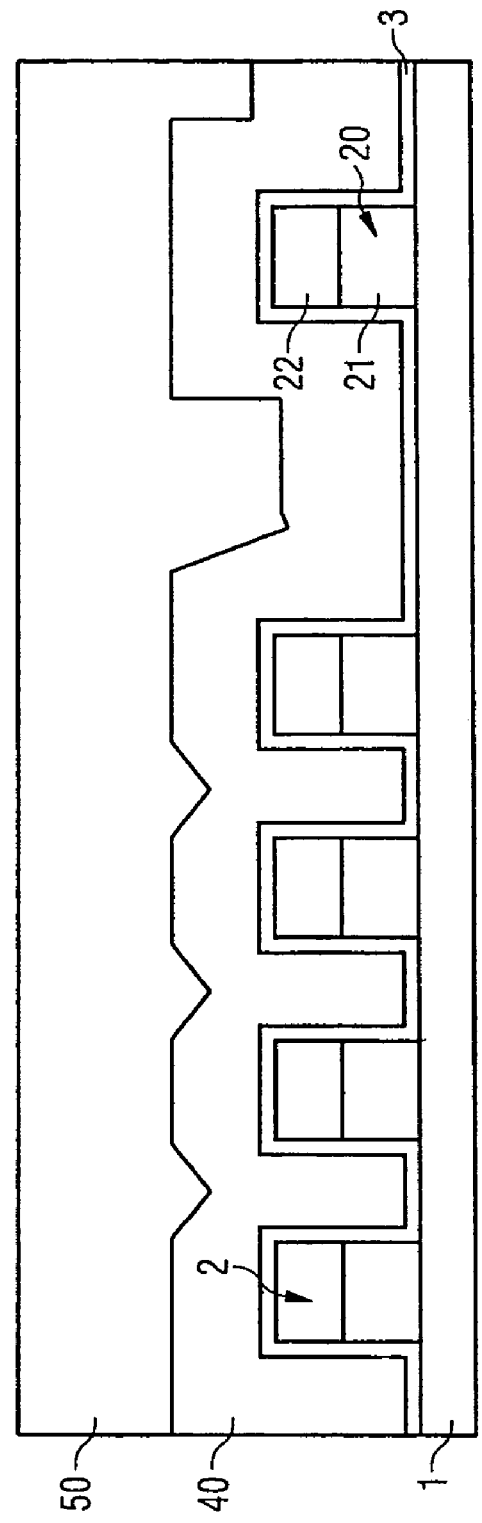

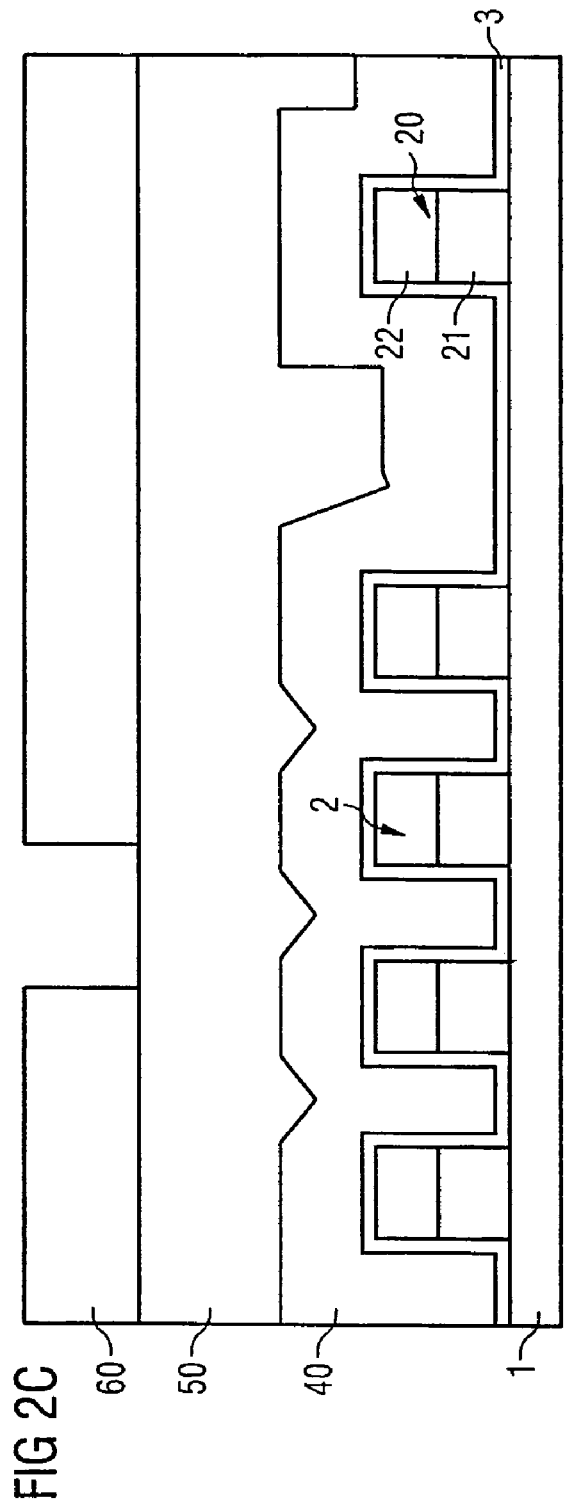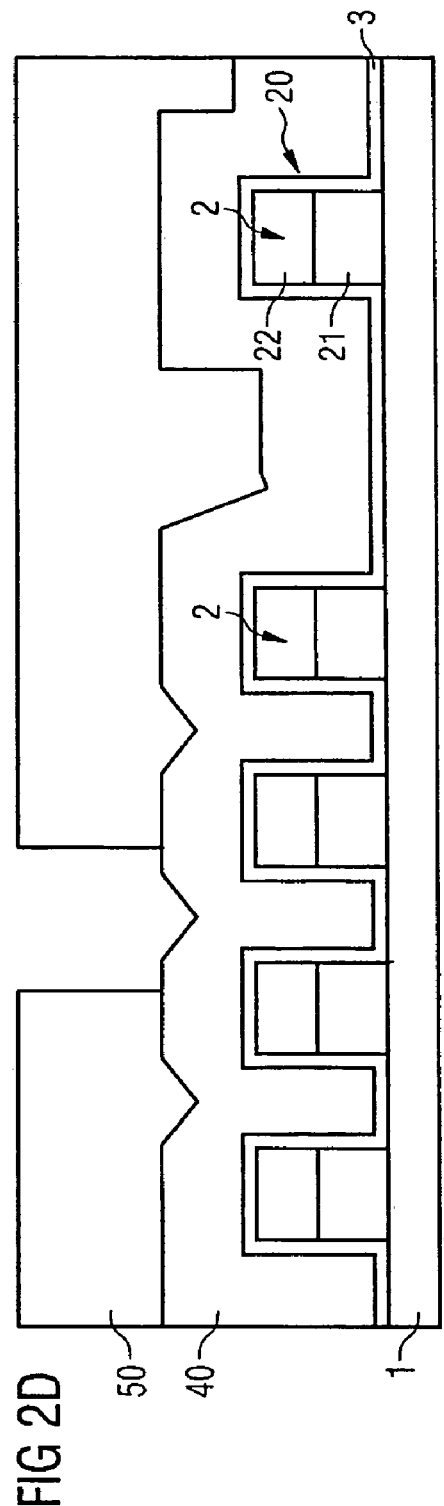

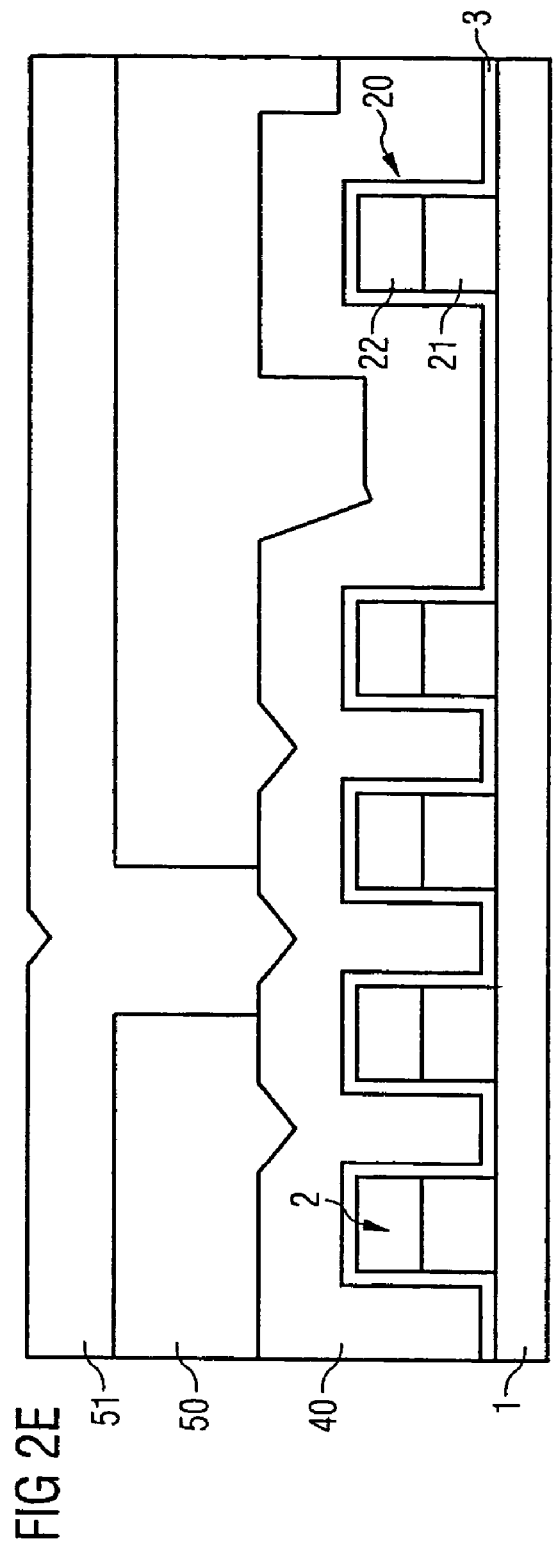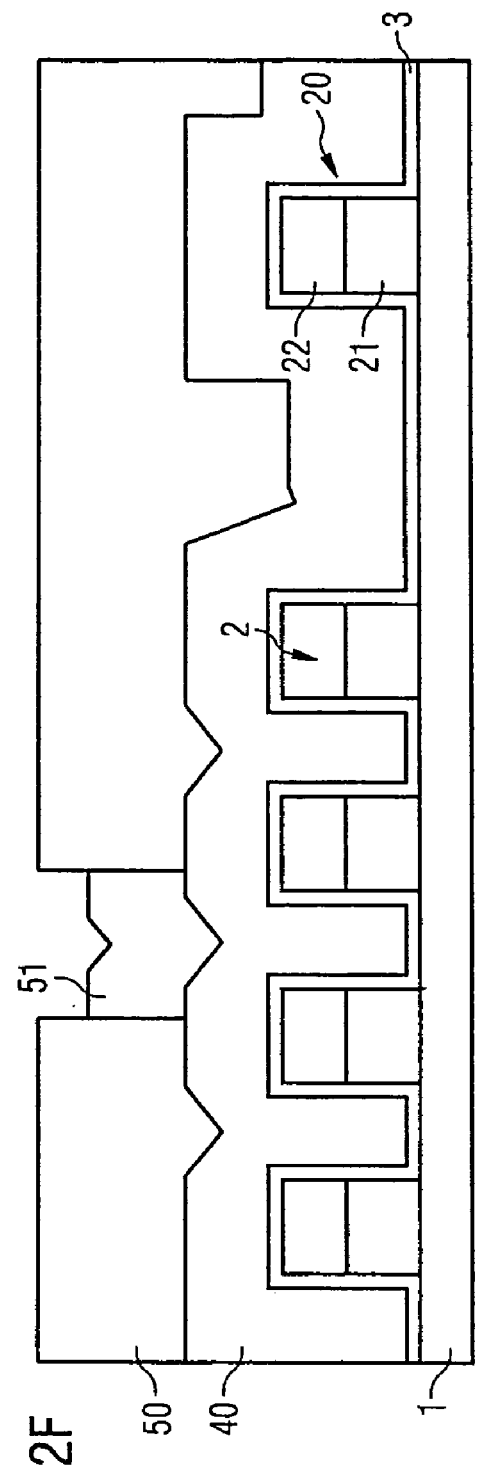

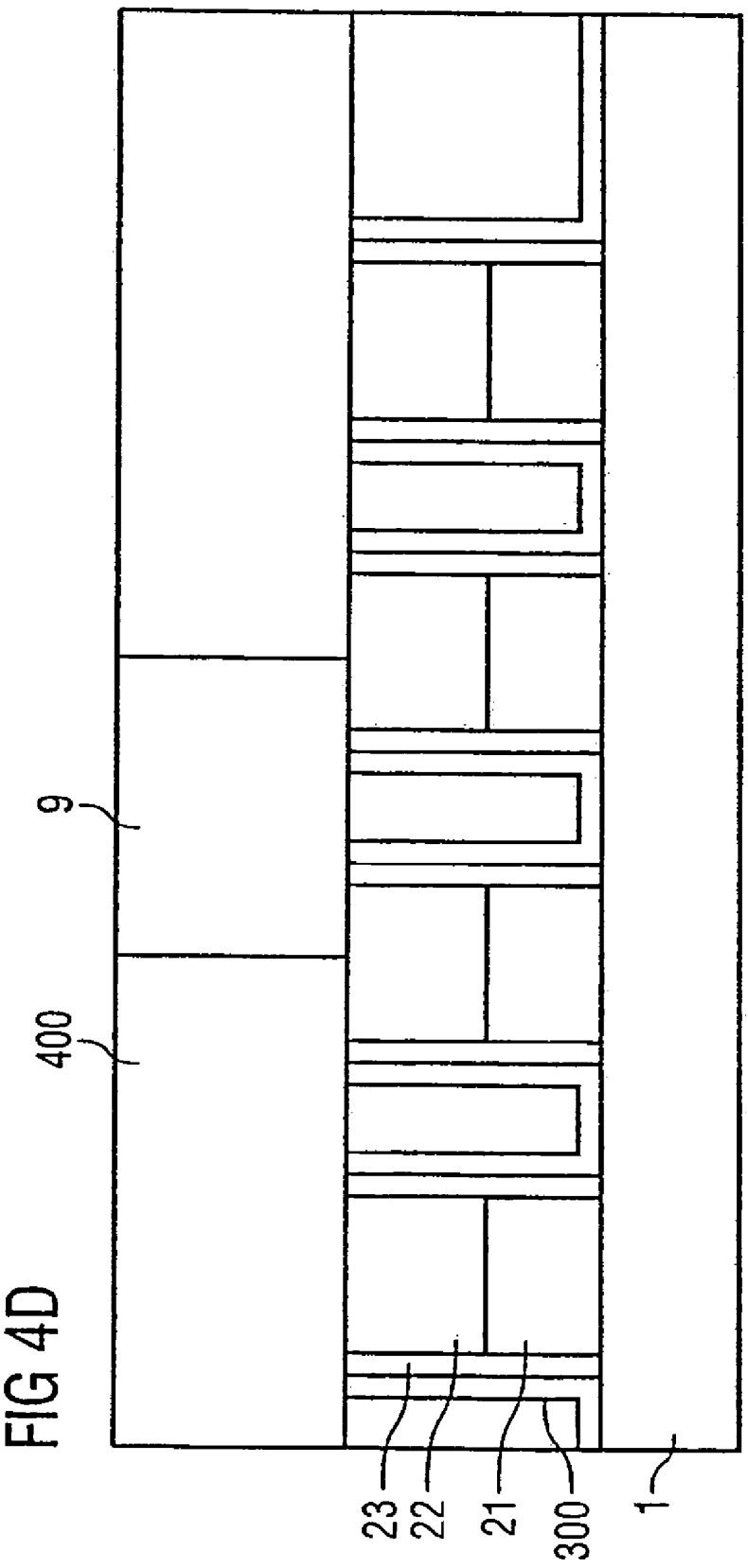

METHOD FOR FABRICATING A CONTACT HOLE PLANE IN A MEMORY MODULE

CLAIM FOR PRIORITY

This application claims priority to German application No. 103 14 274.6 filed Mar. 29, 2003.

TECHNICAL FIELD OF THE INVENTION

The invention relates to a method for fabricating a contact hole plane in a memory module with an arrangement of memory cells each having a selection transistor and in particular to a dynamic random access memory (DRAM).

BACKGROUND OF THE INVENTION

DRAMs are composed of a multiplicity of memory cells which are formed regularly in the form of a matrix on a semiconductor wafer. Said memory cells generally comprise a storage capacitor and a selection transistor. During a read or write operation, the storage capacitor is charged or discharged, via the selection transistor, with an electrical charge corresponding to the respective data unit (Bit). For this purpose, the selection transistor is addressed with the aid of a bit line and a word line.

DRAMs are generally realized with the aid of planar technology. The latter comprises a sequence of individual processes which, in each case, act over the whole area at the surface of the semiconductor wafer and, by suitable masking layers, lead in a targeted manner to the local alteration of the semiconductor material. In this case, the selection transistor of the memory cell is generally embodied as a field-effect transistor, with two highly doped diffusion regions in the semiconductor wafer, which form the source/drain electrodes. A channel is formed between these two diffusion regions, via which channel an electrically conductive connection can be produced with the aid of a gate electrode formed above the channel. In the case of DRAMs, the gate electrodes of the field-effect transistors are realized as gate electrode tracks which run parallel and form the word lines of the DRAM. The bit lines then run transversely over said gate electrode tracks, a conductive connection between a bit line and a source/drain electrode of the selection transistor of a corresponding memory cell being produced in the interspace between two gate electrode tracks.

The bit line contact is usually fabricated as a so-called "self-aligned" contact in the DRAM process. A possible process sequence for forming such bit line contacts is illustrated diagrammatically in FIG. 4. FIGS. 4A to 4D respectively show a cross section through a silicon wafer after various successive process steps for forming the bit line contacts. The starting point is the prepatterned silicon wafer 1, on which gate electrode tracks 2 spaced apart equidistantly have been formed. These gate tracks 2 generally comprise a conductive layer stack 21 covered by a silicon nitride cap 22. Insulating spacers 23, preferably made of silicon nitride, are formed at the sidewalls of the gate electrode tracks 2. A cross section through the correspondingly prepatterned silicon wafer is shown in FIG. 4A.

A further silicon nitride layer 300 is deposited in a first step for forming the bit line contacts. In order to define the region of the bit line contacts on the silicon wafer 1, a mask layer sequence 350, 400 is subsequently produced, and completely covers the bit line contacts. FIG. 4B shows a cross section through the silicon wafer 1 after this process step.

With the aid of a lithography step, the regions at which the bit line contacts of the selection transistors are later intended to be produced are then defined on the mask layer sequence 350, 400. These regions of the mask layer sequence 350, 400 are then opened with the aid of a selective etching. By a further etching, the silicon nitride layer 300 is then removed in the opening regions of the mask layer sequence 350, 400. The resultant silicon wafer configuration is shown in FIG. 4C. During the silicon nitride etching, the silicon nitride layer 300 is etched away essentially only at the horizontal areas, but remains at the sidewalls of the gate electrode tracks 2, as is shown in FIG. 4C.

In a final process step, the contact openings are then filled with a conductive material in order to fabricate the bit line contacts 9. A cross section through the silicon wafer 1 after the production of the bit line contacts 9 is shown in FIG. 4D.

Such a standard process for producing bit line contacts is known inter alia from WO 01/09946. This standard process essentially has three significant disadvantages. The distance between two mutually adjacent gate electrode tracks between which the bit line contact is intended to be embodied is additionally decreased by the silicon nitride spacers at the sidewalls of the gate electrode tracks. This gap narrowing increases the aspect ratio, that is to say, the ratio of width to height of the contact openings, as a result of which processes that are to be performed in the contact openings become increasingly more difficult. This problem is intensified from DRAM generation to DRAM generation on account of the ever smaller lateral dimensions. Furthermore, owing to its high dielectric constant, the silicon nitride spacer in the contact hole leads to a strong coupling between the conductive material in the bit line contact and the gate electrode tracks, so that there is the risk of the electrical properties of the memory cells being impaired. The use of silicon nitride as a spacer for forming the bit line contacts has the disadvantage, moreover, that, on account of the directional etching required, an etching process with a high sputtering element is required, it being possible for the gate electrode tracks to be attacked and damaged particularly in the upper edge region.

SUMMARY OF THE INVENTION

According to one aspect of the invention, an optimized process implementation is provided for fabricating bit line contacts in a memory module. This process implementation is distinguished by a low coupling capacitance between bit line contacts and gate electrode tracks and enabling a reliable and damage-free bit line contact fabrication in a simple manner.

According to an aspect of the invention, in order to fabricate a contact hole plane in a memory module with an arrangement of memory cells each having a selection transistor, a semiconductor substrate is provided with an arrangement of mutually adjacent gate electrode tracks on the semiconductor surface, an insulator layer is produced on the semiconductor surface, a sacrificial layer is formed on the insulator layer, the regions between the mutually adjacent gate electrode tracks essentially being filled and the gate electrode tracks being covered, material plugs are formed on the sacrificial layer for defining contact openings between the mutually adjacent gate electrode tracks, the sacrificial layer is anisotropically etched, the material plugs with the underlying sacrificial layer blocks remaining, a vitreous layer is produced with uncovering of the sacrificial layer blocks above the contact openings between the mutually adjacent gate electrode tracks, the regions between the mutually adjacent gate electrode tracks essentially being filled and an essentially planar surface being formed, sacrificial layer material is etched from the vitreous layer for the purpose of removing the sacrificial layer blocks above the contact openings between the mutually adjacent gate electrode tracks, the uncovered insulator layer above the contact openings on the semiconductor surface between the mutually adjacent gate electrode tracks is removed, and the contact opening regions are filled with a conductive material, in the process forming an essentially planar surface with the surrounding vitreous layer.

The process implementation according to this aspect of the invention makes it possible to completely dispense with the use of a silicon nitride spacer for forming the bit line contacts between the gate electrode tracks running parallel. Instead, it is possible to use material spacers, for example silicon dioxide spacers as insulating spacers which are distinguished, by comparison with silicon nitride spacers, by a significantly smaller dielectric constant and thus a reduced coupling between the conductive material in the bit line contacts and the gate electrode tracks. The sacrificial layer etching, carried out in the process implementation, for opening the contact hole in the vitreous layer is distinguished by a high selectivity during etching, it not being necessary to carry out patterning with the aid of the etching process and thus essentially no sputtering element being necessary during the etching process. This ensures that the gate electrode tracks are not damaged during the contact hole opening.

In accordance with another aspect of the invention, the vitreous layer with uncovering of the sacrificial layer blocks above the contact openings between the mutually adjacent gate electrode tracks is produced by removing the uncovered insulator layer on the semiconductor surface between the mutually adjacent gate electrode tracks, producing dopings in predetermined regions of the uncovered semiconductor surface between the mutually adjacent gate electrode tracks for the purpose of forming the selection transistors, producing an existing liner layer, forming the vitreous layer on the liner layer, the regions between the mutually adjacent gate electrode tracks essentially being filled, and planarizing the vitreous layer with uncovering of the sacrificial layer blocks above the contact openings between the mutually adjacent gate electrode tracks, thereby forming the essentially planar surface.

This procedure represents a particularly effective and cost-effective process implementation in order to form, with the aid of the vitreous layer, a reliable etching mask for the subsequent removal of the sacrificial layer blocks.

In accordance with another aspect of the invention, the polysilicon layer is produced on the insulator layer in the following manner. A first sacrificial layer is deposited on the insulator layer, the regions between the mutually adjacent gate electrode tracks essentially being filled and the gate electrode tracks being covered. The first sacrificial layer is then planarized with uncovering of the gate electrode tracks, an essentially planar surface being formed. Finally, a second sacrificial layer is deposited, the layer thickness of the second sacrificial layer preferably being 200 to 1000 nm.

This procedure provides for a homogenous and highly planar sacrificial layer surface which makes it possible to form even extremely small free-standing resist structures without the latter falling over on account of unevennesses of the underlying sacrificial layer. In particular, this procedure makes it possible to reliably produce, below the resist layer, an ARC layer, which provides for improved resist adhesion and exposure, with a predetermined thickness and a high accuracy. Furthermore, the first sacrificial layer may be planarized by using a chemical mechanical polishing method using a stop polishing technique, said method being stopped by the nitride covering layer of the gate electrode tracks. This chemical mechanical polishing provides for a high surface planarity.

In accordance with another aspect of the invention, the sacrificial layer is formed on the insulator layer by the following method steps. Firstly, the sacrificial layer is deposited on the insulator layer, the regions between the mutually adjacent gate electrode tracks being filled and the gate electrode tracks being covered. The sacrificial layer is then planarized, the gate electrode tracks with a layer thickness of preferably 200 to 1000 nm remaining covered and an essentially planar surface being formed.

This procedure once again makes it possible to form a highly planar sacrificial layer surface for forming even extremely small resist structures preferably with the aid of a previously applied resist layer, the method presented requiring only a single sacrificial layer application and it being possible to use a cost-effective so-called blind polishing process during the chemical mechanical polishing, i.e. a planarization stop after a predetermined time in the polysilicon layer.

In accordance with a further aspect of the invention, the material plugs are formed on the sacrificial layer for defining the contact openings between the mutually adjacent gate electrode tracks by the following method steps. Firstly, preferably an ARC layer is deposited on the sacrificial layer. A resist layer is then applied on the ARC layer and is subsequently exposed by a mask which defines the contact openings between the mutually adjacent gate electrodes, and the resist layer is then developed in order to remove the exposed regions of the resist layer and to form the material plugs made from resist material on the polysilicon layer for the purpose of defining contact openings between the mutually adjacent gate electrode tracks. This procedure makes it possible to form material plugs in a precisely defined form for the purpose of defining the contact openings for the bit line contacts between the gate electrode tracks with the aid of a photoresist layer.

In accordance with yet another aspect of the invention, it is possible to fabricate the material plugs on the sacrificial layer in the following manner. Firstly, a hard mask layer is deposited on the sacrificial layer and then a resist layer is deposited on the hard mask layer. The resist layer is subsequently exposed by a mask which defines the contact openings between the mutually adjacent gate electrode tracks. The resist layer is then developed in order to remove the exposed regions of the resist layer and to uncover the hard mask layer. The patterned resist layer is transferred into the hard mask layer by anisotropic etching. Afterward, the patterned resist layer is removed and a filling material is introduced into the etching openings of the hard mask layer. After the removal of the hard mask layer, material plugs made from the filling material then remain on the sacrificial layer, which define the contact openings between the mutually adjacent gate electrode tracks.

This inversive formation of the material plugs made from a filling material enables even extremely small plug structures to be fabricated reliably. The additionally applied hard mask layer serves as a further sacrificial layer in which openings which are predefined by a lithography step are produced by etching. By filling these openings with a filling material and subsequently removing the hard mask layer, highly precise material plug structures are formed. What is advantageous about this procedure is that it is possible to dispense with planarizing the sacrificial layer lying below the hard mask layer. Furthermore, by the hard mask layer, it is possible to set the plug height exactly to a desired height which is optimal for the subsequent process steps. What is more, a high etching resistance during the hard mask etching can be achieved through a suitable choice of filling material.

In accordance with another aspect of the invention, a vitreous layer is used as the hard mask layer. The use of such an optically transparent hard mask layer in the case of a nonplanar base of the sacrificial layer makes it possible to utilize steps in the sacrificial layer for alignment and overlay measurements of the contact hole lithography.

In accordance with this aspect of the invention, polysilicon is preferably used as the material for the sacrificial layer. Polysilicon enables a particularly high selectivity when etching free the contact hole openings in the vitreous layer, it being possible to carry out the etching process with a very low sputtering element, thereby preventing the contact hole opening from being damaged during the etching process.

In accordance with a further aspect of the invention, a carbon-based layer is used as the sacrificial layer in the contact openings. Carbon enables an oxide etching in a standard dry etching chamber, as a result of which a particularly high selectivity can be achieved. What is more, carbon layers are distinguished by a particularly favorable deposition behavior, a high planarity being established. This provides for a cost-effective layer application process. In this case, furthermore, a dielectric layer is preferably to be additionally applied on the carbon-based layer. This additional dielectric mask layer provides for a high selectivity both with respect to the overlying lithography mask and with respect to the underlying carbon layer and thus for an improvement in the etching behavior.

BRIEF DESCRIPTION OF THE DRAWINGS

FIGS. 1A to 1O show one embodiment of a process sequence according to the invention for fabricating a contact hole plane in a memory module, diagrammatic cross sections through the silicon wafer in different process stages of the process sequence respectively being shown;

FIGS. 2A to 2G show an alternative embodiment of the process sequence according to the invention with regard to the formation of the material plugs on the polysilicon layer for the purpose of defining contact openings between the mutually adjacent gate electrode tracks, the individual figures respectively showing a diagrammatic cross section through the silicon wafer after different process stages;

FIGS. 4A to 4D show a conventional method for forming bit line contacts between gate electrode tracks of a memory module, the individual figures respectively showing cross sections through the silicon wafer after different process stages.

DETAILED DESCRIPTION OF THE INVENTION

Figure 2G:
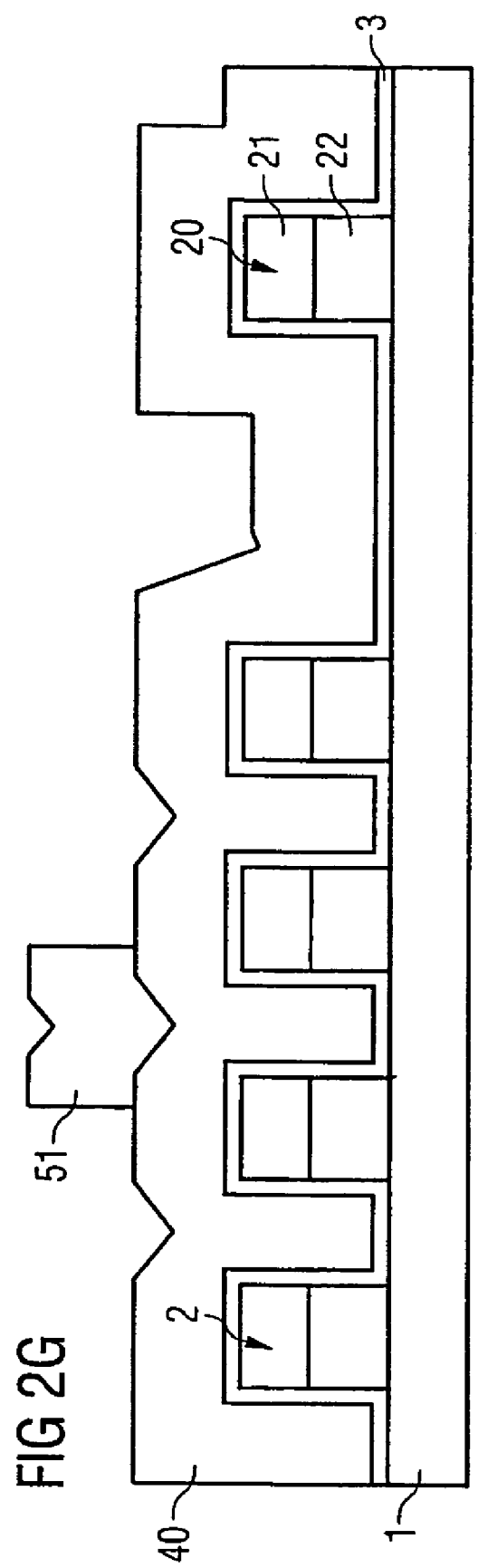

The invention is illustrated by way of example using a process sequence for fabricating a contact hole plane in a DRAM module with a memory cell region and a logic region on a silicon wafer. However the invention can be used to form any desired contacts between gate electrode tracks in semiconductor modules.

FIGS. 1A to 1O respectively show a cross section through a detail from a prepatterned silicon wafer 1, on which a memory cell region and a peripheral logic region are provided. In this case, the memory cells of the DRAM are composed of a selection transistor and a storage capacitor. The peripheral logic region contains various components for driving the memory cells.

FIG. 1A shows the starting point, the prepatterned silicon wafer 1 (structures are not shown), on which are formed a cell array, represented by four gate electrode tracks 2 spaced apart equidistantly, and a logic region separate therefrom, represented by a further gate electrode track 20. In particular, the storage capacitors, preferably formed as trench capacitors, have already been provided in the region of the memory cell array of the silicon wafer 1. The gate electrode tracks 2, which form the word lines in the cell array, are generally composed of a layer stack, comprising a conductive layer 21 and a covering layer 22. In this case, the conductive layer 21 may comprise a metal or else a doped polysilicon. The covering layer 22 is preferably fabricated from silicon nitride.

In a first process step, a silicon dioxide layer 3 is applied to said silicon wafer 1 with the gate electrode tracks 2, 20 prepatterned in a specific way. In this case, the silicon dioxide layer 3 is preferably applied with the aid of the so-called LPCVD method, which ensures a high conformity of the silicon dioxide layer 3. The silicon dioxide layer 3 serves as an insulating spacer between the gate electrode tracks 2. A cross section through the silicon wafer 1 after this process step is shown in FIG. 1B.

Afterward, a polysilicon layer 4 is deposited in large-area fashion on the silicon dioxide layer 3 in a further process step, likewise preferably with the aid of the LPCVD method. In this case, the layer thickness of the polysilicon layer 4 is preferably at least one to three times the height of the gate electrode tracks 2. A cross section through the silicon wafer after this process step is illustrated in FIG. 1C. In this case, the surface of the polysilicon layer 4 exhibits a residual topology of the structure of the underlying gate electrode tracks 2 on the silicon wafer 1.

In a further process step, the surface of the polysilicon layer 4 is then planarized in order to obtain a planar surface. A chemical mechanical polishing process is preferably used for this purpose, it being possible to achieve a particularly high planarity by using a so-called stop polishing process. In this case, the chemical mechanical polishing operation is automatically curbed to a great extent upon impinging on the underlying layer and can thus be ended. A particularly advantageous stop polishing process can be achieved by a stop on the nitride covering layer 22 of the gate electrode track 2. A particularly planar surface then results, as is shown in FIG. 1D, the silicon dioxide layer 3 having been concomitantly polished down from the gate electrode track 2, 20 and the nitride covering layer 22 of the gate electrode tracks 2, 20 being uncovered.

Afterward, in a further deposition process, preferably again with the aid of the LPCVD method, a further polysilicon layer 5 with a layer thickness of 200 to 1000 nm, preferably 300 to 400 nm, is deposited on the first polysilicon layer 4. This results in a highly planar covering of the gate electrode track structure 2 on the silicon wafer 1. A cross section through the silicon wafer 1 after this process step is illustrated in FIG. 1E.

As an alterative to the illustrated process sequence with two polysilicon layers 4, 5 for forming a plane polysilicon layer covering the gate electrode track structure, it is also possible to perform only a single polysilicon deposition and to provide, instead of a chemical mechanical polishing operation according to the stop polishing method, a blind polishing process of the polysilicon layer 4, during which the chemical mechanical polishing operation is stopped in the polysilicon layer 4 itself in a predetermined thickness above the gate electrode tracks 2, 20. In this case, once again a polysilicon thickness above the gate electrode tracks of 200 to 1000 nm, preferably 300 to 400 nm, is preferably intended to remain. What is advantageous about this alternative aspect of the invention is that only a single polysilicon deposition process has to be performed, but the planarity is impaired by comparison with a polysilicon application with two successive deposition processes.

In a further process sequence, the region of the bit line contacts for the connection of the selection transistors of the memory cells in the silicon wafer 1 is defined on the plane polysilicon layer 5. This is preferably performed with the aid of lithography technology. In a first step, preferably an ARC layer 61 is applied and then a resist layer 62 is applied. The ARC layer 61 provides for an improved exposure of the resist layer 62 since the ARC layer 61 essentially prevents reflection of light at the interface. Furthermore, the ARC layer 61 ensures an improved adhesion of the resist material 62. The applied resist layer 61 is exposed with the aid of a mask which defines the regions in which the contact openings between the mutually adjacent gate electrode tracks 2 are intended to be formed. Afterward, the resist layer 62 is developed, the exposed resist structures being stripped away. The result then is a cross section through the silicon wafer 1 as is shown in FIG. 1F, in which resist plugs 6 remain on the polysilicon layer 5 above the contact openings for the bit line contact between the mutually adjacent gate electrode tracks. This procedure makes it possible to produce even extremely small resist plugs having a diameter of less than 150 nm without the resist plugs falling over because of inadequate adhesion.

As an alternative to the use of resist plugs 6, it is also possible to form hard mask blocks above the contact opening regions. In order to form the hard mask blocks, a hard mask layer is applied to the plane polysilicon layer 5 and is then patterned with the aid of a lithography process. For this purpose, a resist layer is applied, which is exposed with the aid of a mask which defines the regions in which the contact openings between the mutually adjacent gate electrode tracks 2 are intended to be formed. Afterward, the resist layer is developed, the exposed resist structures being stripped away outside the contact opening regions. Then, with the aid of a selective etching, the hard mask layer is etched away at the uncovered surface regions and the residual resist layer is subsequently removed, so that material plugs remain similar to the resist plugs 6 in FIG. 1F.

Using the resist plugs 6 or the alternatively fabricated hard mask plugs as a mask, an anisotropic polysilicon etching is then carried out, during which the polysilicon layers 4, 5 are completely removed outside the regions concealed by the resist plugs 6. This anisotropic polysilicon etching for producing blocks 6 in the region of the envisaged contact openings for the bit line contacts, comprising polysilicon blocks with resist covering, is highly selective with respect to silicon dioxide and silicon nitride, so that the silicon dioxide layer 3 on the silicon wafer 1 and the uncovered nitride covering layers 22 of the gate electrode tracks 2, 20 are not attacked. A cross section through the silicon wafer 1 after the anisotropic polysilicon etching is shown in FIG. 1G.

Afterward, the remaining resist plug layer 61 is removed by a resist etching. The uncovered silicon dioxide layer 3 on the silicon wafer 1 is then removed anisotropically, as a result of which the surface of the silicon wafer 1 is uncovered. The silicon dioxide layer 3 in the region of the sidewalls of the gate electrode tracks 2, 20 remains, however. A cross section through the silicon wafer 1 after the process step explained last is illustrated in FIG. 1H.

Through the uncovered surfaces of the silicon wafer 1, standard processes for forming DRAM components are then used to perform the desired dopings in the silicon surface, in particular also for the selection transistors of the memory cells. After the formation of the doped regions in the silicon surface, in a next process step, a liner layer 7 is applied as a diffusion barrier, preferably a silicon nitride layer. A vitreous layer, preferably a BPSG layer 8, is then deposited on said silicon nitride layer 7, and is subjected to a heating step for the purpose of densification and planarization. A cross section through the silicon wafer 1 after the temperature reflow of the BPSG layer 8 is shown in FIG. 1I.

Afterward, a planarization of the BPSG layer 8 is then performed with the aid of a chemical mechanical polishing operation. In this case, the chemical mechanical polishing operation is preferably designed such that it is stopped by an end point determination. In this case, the end point determination used may be an ammonia signal which arises if the silicon nitride liner layer 7 on the polysilicon plugs 4, 5 is polished away during the chemical mechanical polishing operation. A cross section through the silicon wafer 1 after the planarization of the BPSG layer is shown in FIG. 1J. The BPSG layer then forms a highly plane surface, the surface of the polysilicon blocks 4, 5, which are arranged above the contact openings for the bit line contacts to the selection transistors of the memory cells, being uncovered.

In a further process sequence, the surface of the silicon wafer 1 is opened in the region of the contact openings for the bit line contacts. For this purpose, in a first step, by etching, the polysilicon 4, 5 is completely removed from the contact opening. This polysilicon etching can be carried out highly selectively since there is no need to pattern the polysilicon layer, rather the only objective is to completely remove the polysilicon. Therefore, there is also no need for the polysilicon etching process to contain any sputtering components. In this case, the polysilicon etching is preferably carried out as a dry etching. A cross section through the silicon wafer 1 after the removal of the polysilicon blocks from the contact openings is illustrated in cross section in FIG. 1K.

Afterward, the silicon dioxide layer 3 at the bottom of the uncovered contact openings is then removed with the aid of a further etching step, as is shown in FIG. 1L. This process of etching free the silicon wafer surface is preferably effected by using a highly selective silicon dioxide etching process which is distinguished by a particularly good etching behavior of silicon dioxide in the region of deep contact openings. Such a silicon dioxide etching process with a high etching rate in the region of high aspect ratios ensures that, in particular, the BPSG layer 8 is not attacked during etching. What is more, the silicon dioxide spacers remain at the sidewalls of the gate electrode tracks 2 in the region of the contact openings. As an alternative to such a silicon dioxide etching process with high selectivity in the contact hole region, it is also possible to use a standard silicon dioxide etching process, which then also attacks the BPSG covering layer 8. The thickness of the BPSG covering layer must then be designed such that it suffices to enable a corresponding etching removal without the underlying gate electrode tracks 2 being uncovered.

Afterward, by a further process sequence known from the standard DRAM fabrication process, contact is made with the components in the logic region. The contacts to the logic components in the peripheral region of the DRAM are formed with the aid of conventional contact hole lithography. A substrate contact 10 is shown by way of example in FIG. 1M. In addition, connections are also produced to the gate electrode tracks 20 in the logic region (not shown).

In order to form the contacts to the components in the silicon wafer 1, all of the contact openings are then filled with a conductive material, e.g. a metal such as tungsten. All known metal deposition methods may be used in this case. In the case of a tungsten filling, it is possible, by way of example, to first use a tungsten liner and then to perform a large-area filling, the metal layer then being removed again as far as the surface of the BPSG layer 8, thereby producing a cross section through the silicon wafer 1 as is shown in FIG. 1N, in which the contact openings 9, 10 are filled with a conductive metal block. Finally, a further large-area deposition of a conductive material, in particular of a metal such as tungsten or aluminum, is then performed in a further process sequence for forming the first metallization plane M0. This metal plane is then patterned with the aid of photolithography in order to form the wiring of the bit line contacts 9 in the first wiring plane 11. Between the individual interconnects 10, provision is preferably made of a silicon dioxide layer 12 for insulating the interconnects. A cross section through the silicon wafer 1 after the last-mentioned step is shown in FIG. 1O. Further metallization planes for the wiring of the individual components are then performed in the context of the design of the DRAM process.

The process sequence illustrated makes it possible, in the case of producing bit line contacts in the cell array of a DRAM, to achieve three significant advantages over the conventional method, as is illustrated in cross section using the example of a silicon wafer 1 in FIGS. 3A to 3D. A silicon dioxide spacer 3 is used instead of the silicon nitride liner 300 as spacer between the gate electrode tracks 2, as is used in the standard process and is shown in FIG. 4B. Said silicon dioxide spacer 3 is distinguished by a lower dielectric constant and thus a reduced coupling between the conductive filling material of the bit line contacts and the adjacent gate electrode tracks by comparison with the silicon nitride spacer 300. This reduced electrical coupling between the bit line contacts and the gate electrode tracks ensures that the electrical properties of the DRAM are not impaired. This is a significant advantage in particular with regard to the advancing miniaturization of the lateral DRAM dimensions in the course of higher memory cell integration.

What is more, the use of an individual silicon dioxide layer 3 as spacer between the adjacent gate electrode tracks 2 in the region of the bit line contact, by comparison with the silicon nitride liner 300 conventionally used, largely avoids a limitation of the contact hole width, which results in a higher aspect ratio and thus in greater difficulties during the processes to be performed in the contact openings. The use of a polysilicon layer 4, 5 for forming polysilicon blocks in the envisaged contact openings, which are then removed again in order to fill the contact openings, makes it possible to use highly selective etching processes which, in particular, avoid damage to the gate electrode tracks 2. The formation of polysilicon blocks 4, 5 enclosed by a BPSG layer 8 with a silicon nitride liner 7 makes it possible to use etching processes which etch polysilicon in an unpatterned manner. This makes it possible to avoid the use of sputtering components during the etching process, which can lead to damage to the open regions of the gate electrode tracks 2.

FIGS. 2A to 2G illustrate an alternative embodiment for fabricating the polysilicon blocks in the contact opening regions. This alternative procedure ensures a particularly reliable formation of the polysilicon plugs for protecting the contact openings.

In order to form the polysilicon blocks for protecting the contact openings, the method commences in a process stage as is illustrated in FIG. 1C in connection with the first embodiment. On the silicon wafer 1, the prepatterned gate electrode tracks 2, are provided with a silicon dioxide layer 3 and filled with a polysilicon layer 40, the polysilicon layer 40 completely covering the gate electrode tracks 2 but exhibiting the topology of the gate electrode tracks at the surface in attenuated fashion. A cross section through the silicon wafer 1 after this process is illustrated in FIG. 2A.

Then, in a first process step, a vitreous layer 50, preferably a BPSG layer, is applied on the polysilicon layer 40 and levelled preferably with the aid of a chemical mechanical blind polishing operation. A cross section through the silicon wafer 1 after this process step is shown in FIG. 2B.

Afterward, a resist layer 60 is applied and exposed by a perforated mask which defines the contact openings for the bit line contacts between the mutually adjacent gate electrode tracks 2. The resist layer 60 is then developed, the exposed regions of the resist layer being removed and the BPSG layer surface 50 being uncovered in the region of the contact openings. A cross section through the silicon wafer 1 after this process step is illustrated in FIG. 2C.

The patterned resist mask 60 is then used as an etching mask for an anisotropic etching of the BPSG layer 50, the structure of the contact openings in the resist layer 60 being transferred to the BPSG layer 50. A cross section through the silicon wafer 1 after this anisotropic etching of the BPSG layer 50 for the purpose of uncovering the underlying polysilicon surface 40 in the region of the envisaged contact openings is shown in FIG. 2D.

A contact hole filling with a second mask material, e.g. an organic ARC material, is subsequently performed. A large-area filling material deposition is preferably carried out in this case. A cross section through the silicon wafer after the large-area deposition of the ARC layer 51 is illustrated in FIG. 2E.

The ARC layer 51 is then removed again from the surface of the BPSG layer 50, the etching-back being performed in such a way that an overetching takes place and the ARC layer 51 is also removed from an upper region of the contact openings. A cross section through the silicon wafer 1 after this ARC material etching-back is shown in FIG. 2F.

Finally, the BPSG layer 50 is then completely removed in a further etching step, thereby producing an ARC material block 51 in the region of the envisaged contact openings for the bit line contacts between the mutual adjacent gate electrode tracks 2, as is shown in cross section in FIG. 2G.

The structure of the ARC material plug may then be transferred to the underlying polysilicon layer 4 by a further etching, so that only the ARC material plug with the underlying polysilicon region remains and a structure as occurs in the case of the first embodiment, in the process stage shown in FIG. 1F, then results. Afterward, if appropriate, the remaining ARC material may then be removed again and the method continues with the process sequence for forming the bit line contacts and the first metallization plane, as is illustrated in FIGS. 1G to 1O.

The illustrated variant for forming the polysilicon plugs which protect the contact openings makes it possible in particular to dispense with additional complicated polishing techniques for fabricating smooth surfaces on the polysilicon layer, which are necessary for a resist patterning with resist plugs. What is more, through the use of the further hard mask layer made of a vitreous material on the non plane base formed by the polysilicon layer 40, the lithography process illustrated affords the advantage that steps in said polysilicon layer 40 can be utilized in a simple manner for mask orientation during the contact hole lithography. The use of the BPSG layer 50 furthermore makes it possible to accurately set the plug height above the contact openings and to use a material such as ARC with high etching resistance for the polysilicon etching in particular as a plug material, thereby enabling the plug structure to be transferred exactly to the polysilicon layer 40.

In the embodiments described previously, polysilicon has always been used as the material for the sacrificial layer for defining the contact hole openings. Polysilicon is distinguished by a particularly high selectivity when etching free contact holes in particular with respect to the surrounded vitreous layer and also with respect to the surrounding gate electrode tracks. This is because it is possible to use, for the polysilicon etching, an isotropic etching preferably based on a halogen while dispensing with virtually any sputtering element, i.e. without ion bombardment. This ensures that the polysilicon can be etched out completely, without damage in particular to the gate electrode tracks.

As an alternative to a sacrificial layer comprising polysilicon, however, it is also possible to use a different sacrificial layer material. In this case, a carbon-based layer is also suitable, in particular, as sacrificial layer material. Carbon can be removed in a simple manner in the context of a conventional dry etching method using oxygen and is distinguished by a high selectivity with respect to other materials. Depending on the deposition process, the carbon-based layer can be applied in a simple manner and thus cost-effectively with a high planarity, an additional planarization step generally not being necessary.

Figure 3A:
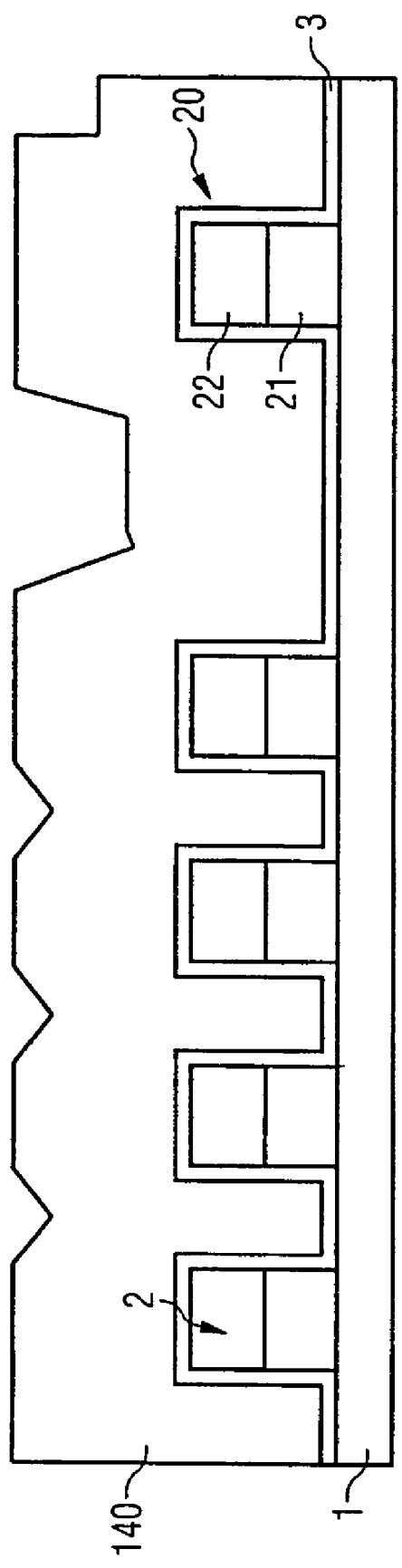
FIGS. 3A to 3D show a further embodiment of the process sequence according to the invention with regard to the formation of the metal plugs, use being made of a carbon layer for the purpose of defining contact openings between the mutually adjacent gate electrode tracks and the individual figures respectively showing a diagrammatic cross section through the silicon wafer in different process stages of the process sequence.
Figure 3B:
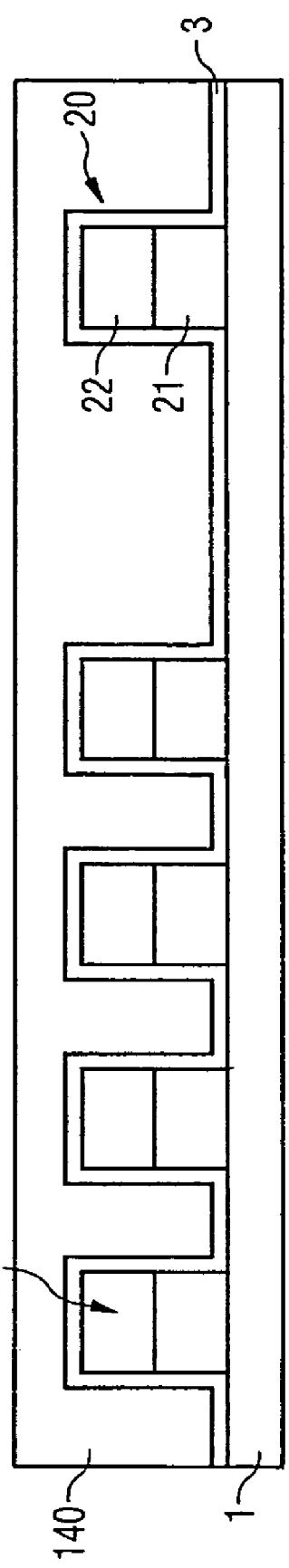

FIGS. 3A to 3D show a possible embodiment, again proceeding from a method stage as is shown in cross section in FIG. 1B, the gate electrode tracks 2, 20 having been applied on the prepatterned silicon wafer 1 in a first process step, the silicon dioxide layer 3 then having been deposited thereon in a large-area manner in a second process step. Proceeding from this process stage, preferably a carbon layer 140 is then deposited in a further process step. In this case, the layer thickness of the carbon layer 140 preferably corresponds to at least one to three times the height of the gate electrode tracks 2, 20. FIG. 3A shows a cross section through the silicon wafer after this process step.

In the illustration shown in FIG. 3A, the topology of the underlying gate electrode tracks 2, 20 on the silicon wafer 1 can be discerned on the surface of the carbon layer 140. However, it is also possible to control the deposition process of the carbon-containing layer in such a way that an essentially plane carbon layer surface is produced. In this case, the further process step shown in FIG. 3B, in which the surface of the carbon layer 140 is planarized, is then unnecessary.

Figure 3C:
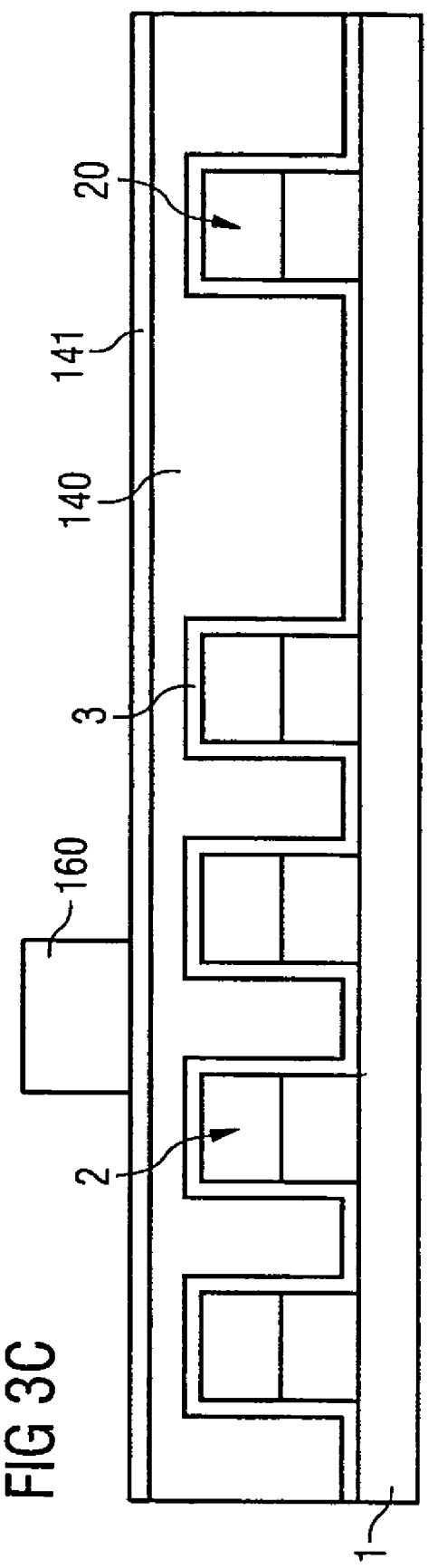
Figure 4A:
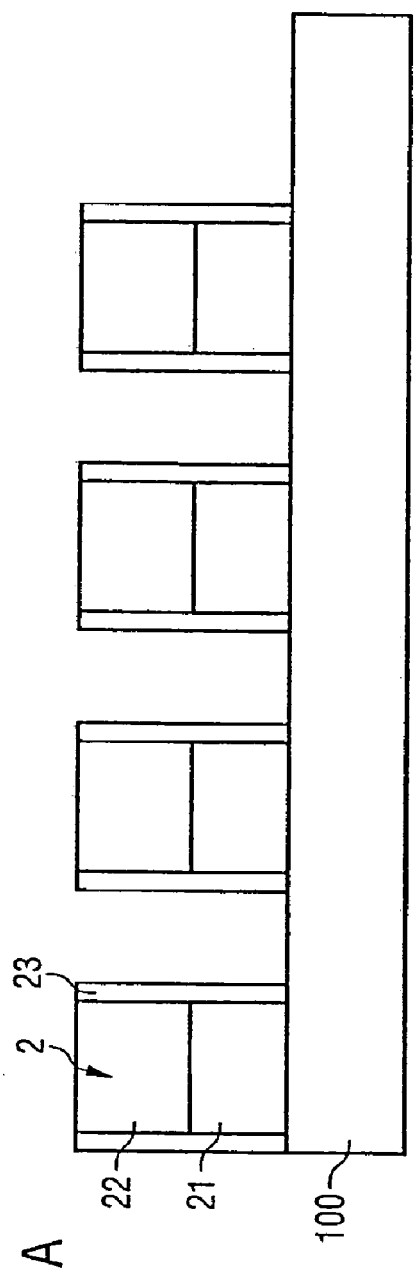
Figure 4B:
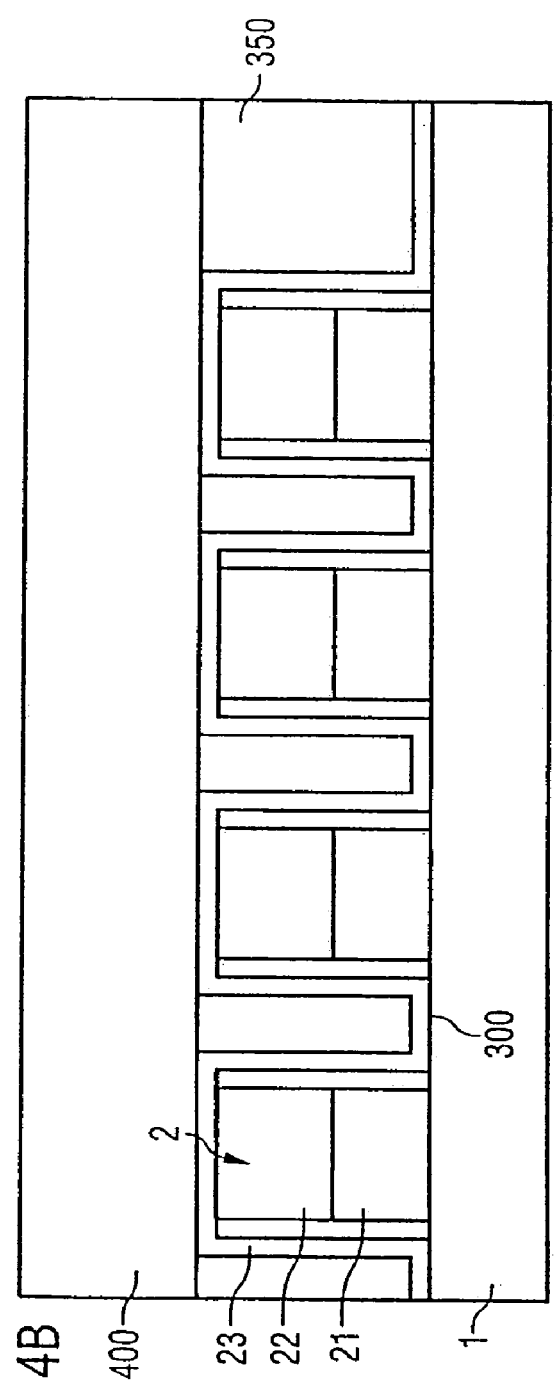
Figure 4C:
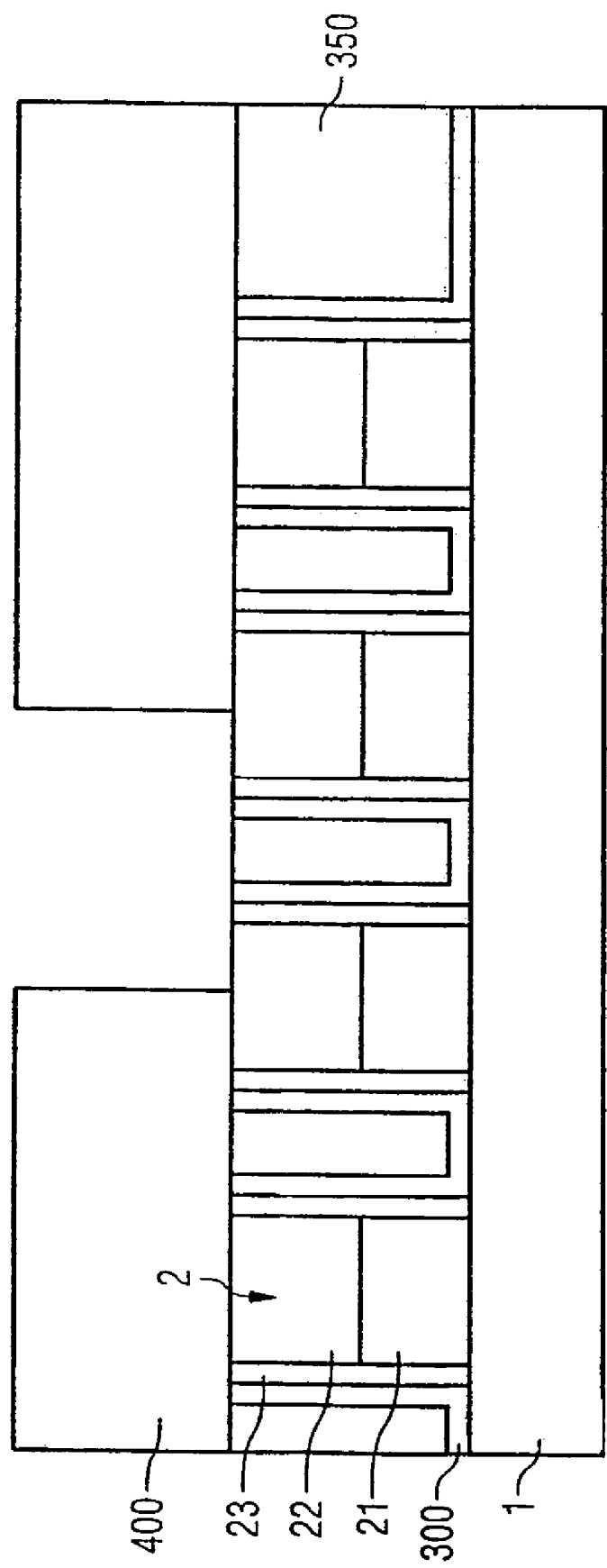

Afterward, as shown in FIG. 3C, a thin hard mask layer 141 made of silicon oxide, silicon nitride or silicon oxide-nitride is additionally deposited on the planar carbon layer surface. The regions of the bit line contacts for the connection of the selection transistors of the memory cells in the silicon wafer 1 are then defined on the hard mask layer 141 once again with the aid of lithography technology, as already illustrated with reference to FIG. 1F in the case of the process sequence shown in FIG. 1. For this purpose, a resist layer 160 is patterned in such a way that the resist plugs shown in FIG. 3C remain above the contact openings for the bit line contacts between the mutually adjacent gate electrode tracks 2, 20.

Figure 3D:
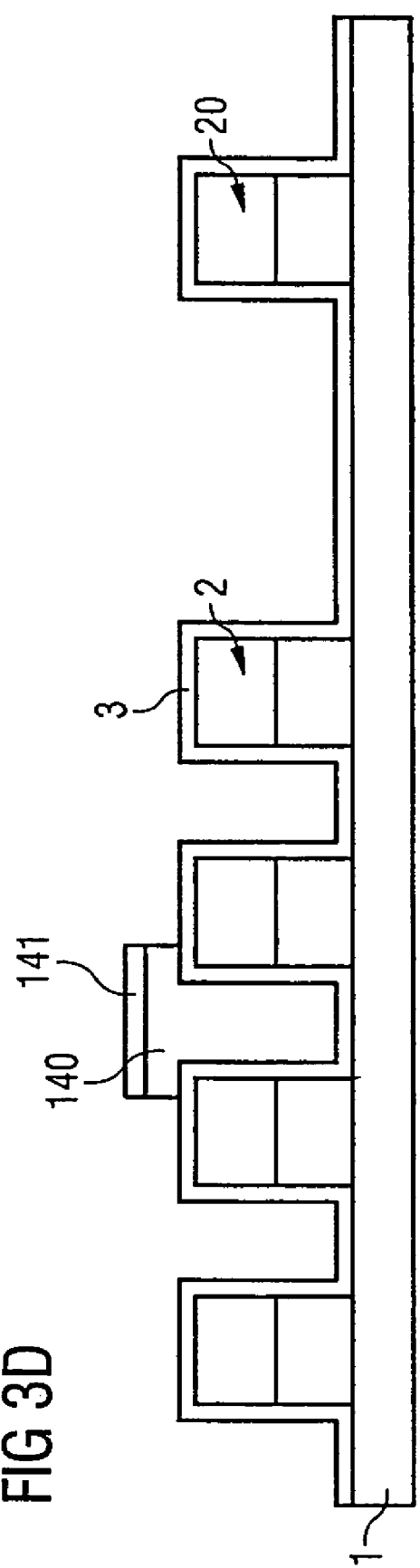

In a next process step, the hard mask layer 141 is then prepatterned and, in a further process step, the prepatterning is transferred into the carbon layer by an etching which is selective with respect to the hard mask layer. In this case, it is possible to achieve higher etching rates than in the case of polysilicon. The result then is a cross section of the silicon wafer as is illustrated in FIG. 3D, in which carbon plugs conceal the contact openings between the gate electrode tracks highly precisely and accurately.

Afterward, the process sequence shown in FIGS. 1H to 1O may then be carried out, the etching free of the remaining carbon layer plugs between the gate electrode tracks being effected by a simple dry etching using oxygen highly selectively with respect to the surrounded vitreous layer. As an alternative to the process sequence shown in FIGS. 3A to 3D, it is also possible to form the carbon layer plugs in accordance with the process sequences shown in FIGS. 1 and 2, respectively.

What is claimed is:

1. A method for fabricating a first contact hole plane in a memory module with an arrangement of memory cells each having a selection transistor, comprising:
   A) providing a semiconductor substrate with an arrangement of mutually adjacent gate electrode tracks on a surface of the semiconductor;
   B) producing an insulator layer on the semiconductor surface;
   C) forming a sacrificial layer on the insulator layer, where regions between the mutually adjacent gate electrode tracks are essentially filled and the gate electrode tracks are covered;
   D) forming material plugs on the sacrificial layer for defining a first set of contact openings between the mutually adjacent gate electrode tracks;
   E) anistropically etching the sacrificial layer, where the material plugs with the underlying sacrificial layer blocks;
   F) producing a vitreous layer with uncovering of the sacrificial layer blocks above the contact openings between the mutually adjacent gate electrode tracks, where the regions between the mutually adjacent gate electrode tracks are essentially filled and an essentially planar surface is formed, wherein step F comprises the following steps F1–F6:
      F1) removing the material plugs;
      F2) removing the uncovered insulator layer on the semiconductor surface between a second set of mutually adjacent gate electrode tracks;
      F3) producing dopings in predetermined regions of the uncovered semiconductor surface between the mutually adjacent gate electrode tracks for forming the selection transistors;
      F4) producing a liner layer, which includes silicon nitride;
      F5) forming the vitreous layer on the liner layer, the regions between the mutually adjacent gate electrode tracks essentially being filled; and
      F6) planarizing the vitreous layer with uncovering of the sacrificial layer blocks above the contact openings between the mutually adjacent gate electrode tracks, thereby forming the essentially planar surface;

G) etching sacrificial layer material from the vitreous layer for removing the sacrificial layer blocks above the contact openings between the mutually adjacent gate electrode tracks;

H) removing the uncovered insulator layer above the first set of contact openings on the semiconductor surface between the mutually adjacent gate electrode tracks; and I) filling the contact opening regions with a conductive material, in the process forming an essentially planar surface with the surrounding vitreous layer.

2. The method as claimed in claim 1, wherein the liner layer is a silicon nitride layer or a silicon oxide-nitride layer.

3. The method as claimed in claim 1, wherein the planarization in method step F6) is effected by chemical mechanical polishing and the end point of the polishing operation being defined at the establishment of a material removal of the liner layer.

4. The method as claimed in claim 1, wherein the vitreous layer formed in method step F) is a BPSG layer.

5. The method as claimed in claim 1, wherein method step C) comprises:

C1) depositing a first sacrificial layer on the insulator layer, the regions between the mutually adjacent gate electrode tracks essentially being filled and the gate electrode tracks being covered;

C2) planarizing the first sacrificial layer with uncovering of the gate electrode tracks, an essentially planar surface being formed; and C3) depositing a second sacrificial layer.

6. The method as claimed in claim 5, wherein the second sacrificial layer has a layer thickness of 200 nm to 1000 nm.

7. The method as claimed in claim 1, wherein step C) comprises:

C1') depositing the sacrificial layer on the insulator layer, where the regions between the mutually adjacent gate electrode tracks are filled and the gate electrode tracks are covered; and C2') planarizing the sacrificial layer, where the gate electrode tracks remain covered and an essentially planar surface is formed.

8. The method as claimed in claim 7, wherein the sacrificial layer a layer thickness of 200 nm to 1000 nm above the gate electrode tracks.

9. The method as claimed in claim 1, wherein the insulator layer is a silicon dioxide layer.

10. The method as claimed in claim 1, wherein step D) comprises:

D1) depositing a resist layer;

D2) exposing the resist layer by a mask which defines the contact openings between the mutually adjacent gate electrode tracks; and D3) developing the resist layer to remove the exposed regions of the resist layer and to form the material plugs made from resist material on the sacrificial layer for defining contact openings between the mutually adjacent gate electrode tracks.

11. The method as claimed in claim 10, wherein an ARC layer is applied on the sacrificial layer before the resist layer.

12. A method for fabricating a first contact hole plane in a memory module with an arrangement of memory cells each having a selection transistor, comprising:

A) providing a semiconductor substrate with an arrangement of mutually adjacent gate electrode tracks on a surface of the semiconductor;

B) producing an insulator layer on the semiconductor surface;

C) forming a sacrificial layer on the insulator layer, where regions between the mutually adjacent gate electrode tracks are essentially filled and the gate electrode tracks are covered;

D) forming material plugs on the sacrificial layer for defining contact openings between the mutually adjacent gate electrode tracks, wherein step D comprises the following steps D1'–D6':

D1') depositing a hard mask layer on the sacrificial layer;

D2') depositing a resist layer on the hard mask layer;

D3') exposing the resist layer by a mask which defines the contact openings between the mutually adjacent gate electrode tracks;

D4') developing the resist layer to remove the exposed regions of the resist layer outside the contact openings between the mutually adjacent gate electrode tracks;

D5') anistropically etching the hard mask layer with the patterned resist layer as a mask; and D6') removing the residual resist layer;

E) anistropically etching the sacrificial layer, where the material plugs with the underlying sacrificial layer blocks;

F) producing a vitreous layer with uncovering of the sacrificial layer blocks above the contact openings between the mutually adjacent gate electrode tracks, where the regions between the mutually adjacent gate electrode tracks are essentially filled and an essentially planar surface is formed;

G) etching sacrificial layer material from the vitreous layer for removing the sacrificial layer blocks above the contact openings between the mutually adjacent gate electrode tracks;

H) removing the uncovered insulator layer above the contact openings on the semiconductor surface between the mutually adjacent gate electrode tracks; and I) filling the contact opening regions with a conductive material, in the process forming an essentially planar surface with the surrounding vitreous layer.

13. The method as claimed in claim 12, wherein the sacrificial layer is a polysilicon layer.

14. The method as claimed in claim 12, wherein the sacrificial layer is a carbon layer.

15. The method as claimed in claim 14, wherein a dielectric hard mask layer is additionally provided on the carbon layer.

16. A method for fabricating a first contact hole plane in a memory module with an arrangement of memory cells each having a selection transistor, comprising:

A) providing a semiconductor substrate with an arrangement of mutually adjacent gate electrode tracks on a surface of the semiconductor;

B) producing an insulator layer on the semiconductor surface;

C) forming a sacrificial layer on the insulator layer, where regions between the mutually adjacent gate electrode tracks are essentially filled and the gate electrode tracks are covered;

D) forming material plugs on the sacrificial layer for defining contact openings between the mutually adjacent gate electrode tracks, wherein step D comprises the following steps D1"–D9":
D1") forming a hard mask layer on the sacrificial layer;
D2") planarizing the hard mask layer;
D3") depositing a resist layer on the hard mask layer;
D4") exposing the resist layer by a mask which defines the contact openings between the mutually adjacent gate electrode tracks;
D5") developing the resist layer in order to remove the exposed regions of the resist layer and to uncover the hard mask layer;
D6") anistropically etching of the hard mask layer with the patterned resist layer as a mask;
D7") removing the patterned resist layer;
D8") introducing a filling material into the etching openings in the hard mask layer; and
D9") removing the hard mask layer to form the material plugs made from the filling material on the sacrificial layer for defining contact openings between the mutually adjacent gate electrode tracks;
E) anistropically etching the sacrificial layer, where the material plugs with the underlying sacrificial layer blocks;
F) producing a vitreous layer with uncovering of the sacrificial layer blocks above the contact openings between the mutually adjacent gate electrode tracks, where the regions between the mutually adjacent gate electrode tracks are essentially filled and an essentially planar surface is formed;
G) etching sacrificial layer material from the vitreous layer for removing the sacrificial layer blocks above the contact openings between the mutually adjacent gate electrode tracks;
H) removing the uncovered insulator layer above the contact openings on the semiconductor surface between the mutually adjacent gate electrode tracks; and
I) filling the contact opening regions with a conductive material, in the process forming an essentially planar surface with the surrounding vitreous layer.

17. The method as claimed in claim 16, wherein the hard mask layer is a BPSG layer, and the filling material is an organic ARC material.

18. The method as claimed in claim 16, wherein the sacrificial layer is a polysilicon layer.

19. The method as claimed in claim 16, wherein the sacrificial layer is a carbon layer.

20. A method for fabricating a first contact hole plane in a memory module with an arrangement of memory cells each having a selection transistor, comprising:
A) providing a semiconductor substrate with an arrangement of mutually adjacent gate electrode tracks on a surface of the semiconductor;
B) producing an insulator layer on the semiconductor surface;
C) forming a sacrificial layer on the insulator layer, the regions between the mutually adjacent gate electrode tracks essentially being filled and the gate electrode tracks being covered;
D) forming material plugs on the sacrificial layer for defining contact openings between the mutually adjacent gate electrode tracks;
E) anistropically etching of the sacrificial layer, the material plugs with the underlying sacrificial layer blocks remaining;
F) producing a vitreous layer with uncovering of the sacrificial layer blocks above the contact openings between the mutually adjacent gate electrode tracks, the regions between the mutually adjacent gate electrode tracks essentially being filled and an essentially planar surface being formed;
G) etching sacrificial layer material from the vitreous layer for removing the sacrificial layer blocks above the contact openings between the mutually adjacent gate electrode tracks;
H) removing the uncovered insulator layer above the contact openings on the semiconductor surface between the mutually adjacent gate electrode tracks; and
I) filling the contact opening regions with a conductive material, in the process forming an essentially planar surface with the surrounding vitreous layer,
wherein
step C) comprises:
C1') depositing a first sacrificial layer on the insulator layer, the regions between the mutually adjacent gate electrode tracks essentially being filled and the gate electrode tracks being covered;
C2') planarizing the first sacrificial layer with uncovering of the gate electrode tracks, an essentially planar surface being formed; and
C3') depositing a second sacrificial layer.

21. The method as claimed in claim 20, wherein the second sacrificial layer has a layer thickness of 200 nm to 1000 nm.

22. The method as claimed in claim 20, wherein step D) comprises:
D1') depositing a resist layer;
D2') exposing the resist layer by a mask which defines the contact openings between the mutually adjacent gate electrode tracks; and
D3') developing the resist layer to remove the exposed regions of the resist layer and to form the material plugs made from resist material on the sacrificial layer for defining contact openings between the mutually adjacent gate electrode tracks.

23. The method as claimed in claim 22, wherein an ARC layer is applied on the sacrificial layer before the resist layer.

24. The method as claimed in claim 20, wherein the insulator layer is a silicon dioxide layer.

25. The method as claimed in claim 20, wherein step F) comprises:
F1) removing the material plugs;
F2) removing the uncovered insulator layer on the semiconductor surface between the mutually adjacent gate electrode tracks;
F3) producing dopings in predetermined regions of the uncovered semiconductor surface between the mutually adjacent gate electrode tracks for forming the selection transistors;
F4) producing a liner layer;
F5) forming the vitreous layer on the liner layer, the regions between the mutually adjacent gate electrode tracks essentially being filled; and
F6) planarizing the vitreous layer with uncovering of the sacrificial layer blocks above the contact openings between the mutually adjacent gate electrode tracks, the essentially planar surface being formed.

26. The method as claimed in claim 25, wherein the liner layer is a silicon nitride layer or a silicon oxide-nitride layer.

27. The method as claimed in claim 25, wherein the planarization in step F6) is effected by chemical mechanical polishing and an end point of the polishing operation is defined at the establishment of a material removal of the liner layer.

28. The method as claimed in claim 20, the vitreous layer formed in step F) being a BPSG layer.

29. A method for fabricating a first contact hole plane in a memory module with an arrangement of memory cells each having a selection transistor, comprising:
- A) providing a semiconductor substrate with an arrangement of mutually adjacent gate electrode tracks a surface of the semiconductor;
- B) producing an insulator layer on the semiconductor surface;
- C) forming a sacrificial layer on the insulator layer, the regions between the mutually adjacent gate electrode tracks essentially being filled and the gate electrode tracks being covered;
- D) forming material plugs on the sacrificial layer for defining contact openings between the mutually adjacent gate electrode tracks;
- E) anistropically etching of the sacrificial layer, the material plugs with the underlying sacrificial layer blocks remaining;
- F) producing a vitreous layer with uncovering of the sacrificial layer blocks above the contact openings between the mutually adjacent gate electrode tracks, the regions between the mutually adjacent gate electrode tracks essentially being filled and an essentially planar surface being formed;
- G) etching sacrificial layer material from the vitreous layer for removing the sacrificial layer blocks above the contact openings between the mutually adjacent gate electrode tracks;
- H) removing the uncovered insulator layer above the contact openings on the semiconductor surface between the mutually adjacent gate electrode tracks; and
- I) filling the contact opening regions with a conductive material, in the process forming an essentially planar surface with the surrounding vitreous layer, wherein step C) comprises:
- C1") forming a plane first sacrificial layer on the insulator layer, the regions between the mutually adjacent gate electrode tracks essentially being filled and the gate electrode tracks being covered; and
- C2") depositing a hard mask layer formed as a second sacrificial layer.

* * * * *